United States Patent
Foster

(10) Patent No.: US 7,245,007 B1
(45) Date of Patent: Jul. 17, 2007

(54) EXPOSED LEAD INTERPOSER LEADFRAME PACKAGE

(75) Inventor: Donald Craig Foster, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 272 days.

(21) Appl. No.: 10/667,226

(22) Filed: Sep. 18, 2003

(51) Int. Cl.
*H01L 23/02* (2006.01)

(52) U.S. Cl. .................. 257/678; 257/666; 257/684; 257/676; 257/680; 257/787; 257/734; 257/671; 257/673

(58) Field of Classification Search ........... 257/678, 257/666, 684, 676, 680, 787, 671, 673, 734
See application file for complete search history.

(56) References Cited

U.S. PATENT DOCUMENTS

| | | | |
|---|---|---|---|
| 2,596,993 A | 5/1952 | Gookin | |
| 3,435,815 A | 4/1969 | Forcier | |
| 3,734,660 A | 5/1973 | Davies et al. | |
| 3,838,984 A | 10/1974 | Crane et al. | |
| 4,054,238 A | 10/1977 | Lloyd et al. | |
| 4,189,342 A | 2/1980 | Kock | |
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |
| 4,451,224 A | 5/1984 | Harding | |
| 4,530,152 A | 7/1985 | Roche et al. | |
| 4,541,003 A | 9/1985 | Otsuka et al. | |
| 4,646,710 A | 3/1987 | Schmid et al. | |
| 4,707,724 A | 11/1987 | Suzuki et al. | |
| 4,727,633 A | 3/1988 | Herrick | |
| 4,737,839 A | 4/1988 | Burt | |
| 4,756,080 A | 7/1988 | Thorp, Jr. et al. | |
| 4,812,896 A | 3/1989 | Rothgery et al. | |
| 4,862,245 A | 8/1989 | Pashby et al. | |
| 4,862,246 A | 8/1989 | Masuda et al. | |
| 4,907,067 A | 3/1990 | Derryberry | |

(Continued)

FOREIGN PATENT DOCUMENTS

DE      19734794 A1      8/1997

(Continued)

*Primary Examiner*—Sara Crane
*Assistant Examiner*—Junghwa Im
(74) *Attorney, Agent, or Firm*—Stetina Brunda Garred & Brucker

(57) ABSTRACT

An interposer for use in an external lead or land pattern semiconductor package. The interposer includes an interposer body which is molded from a dielectric material. The interposer body defines opposed top and bottom surfaces, an outer peripheral edge, and an inner peripheral edge. Embedded within the interposer body is a die pad which itself defines opposed top and bottom surfaces and a peripheral edge. The bottom surface of the die pad is exposed in and substantially flush with the bottom surface of the interposer body, with the inner peripheral edge of the interposer body and the top surface of the die pad collectively defining a cavity of the interposer. A plurality of electrically conductive interposer leads are embedded within the top surface of the interposer body and at least partially exposed therein. The interposer body forms a nonconductive barrier between each of the interposer leads and between the interposer leads and the die pad.

15 Claims, 15 Drawing Sheets

U.S. PATENT DOCUMENTS

| | | | |
|---|---|---|---|
| 4,920,074 A | 4/1990 | Shimizu et al. | |
| 4,935,803 A | 6/1990 | Kalfus et al. | |
| 4,942,454 A | 7/1990 | Mori et al. | |
| 4,987,475 A | 1/1991 | Schlesinger et al. | |
| 5,018,003 A | 5/1991 | Yasunaga et al. | |
| 5,029,386 A | 7/1991 | Chao et al. | |
| 5,041,902 A | 8/1991 | McShane | |
| 5,057,900 A | 10/1991 | Yamazaki | |
| 5,059,379 A | 10/1991 | Tsutsumi et al. | |
| 5,065,223 A | 11/1991 | Matsuki et al. | |
| 5,070,039 A | 12/1991 | Johnson et al. | |
| 5,087,961 A | 2/1992 | Long et al. | |
| 5,091,341 A | 2/1992 | Asada et al. | |
| 5,096,852 A | 3/1992 | Hobson | |
| 5,118,298 A | 6/1992 | Murphy | |
| 5,151,039 A | 9/1992 | Murphy | |
| 5,157,475 A | 10/1992 | Yamaguchi | |
| 5,157,480 A | 10/1992 | McShane et al. | |
| 5,168,368 A | 12/1992 | Gow, 3rd et al. | |
| 5,172,213 A | 12/1992 | Zimmerman | |
| 5,172,214 A | 12/1992 | Casto | |
| 5,175,060 A | 12/1992 | Enomoto et al. | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,218,231 A | 6/1993 | Kudo | |
| 5,221,642 A | 6/1993 | Burns | |
| 5,250,841 A | 10/1993 | Sloan et al. | |
| 5,252,853 A | 10/1993 | Michii | |
| 5,258,094 A | 11/1993 | Furui et al. | |
| 5,266,834 A | 11/1993 | Nishi et al. | |
| 5,273,938 A | 12/1993 | Lin et al. | |
| 5,277,972 A | 1/1994 | Sakumoto et al. | |
| 5,278,446 A | 1/1994 | Nagaraj et al. | |
| 5,279,029 A | 1/1994 | Burns | |
| 5,294,897 A | 3/1994 | Notani et al. | |
| 5,327,008 A | 7/1994 | Djennas et al. | |
| 5,332,864 A | 7/1994 | Liang et al. | |
| 5,335,771 A | 8/1994 | Murphy | |
| 5,336,931 A | 8/1994 | Juskey et al. | |
| 5,343,076 A | 8/1994 | Katayama et al. | |
| 5,358,905 A | 10/1994 | Chiu | |
| 5,365,106 A | 11/1994 | Watanabe | |
| 5,381,042 A | 1/1995 | Lerner et al. | |
| 5,391,439 A | 2/1995 | Tomita et al. | |
| 5,406,124 A | 4/1995 | Morita et al. | |
| 5,410,180 A | 4/1995 | Fujii et al. | |
| 5,414,299 A | 5/1995 | Wang et al. | |
| 5,424,576 A | 6/1995 | Djennas et al. | |
| 5,428,248 A | 6/1995 | Cha | |
| 5,435,057 A | 7/1995 | Bindra et al. | |
| 5,444,301 A | 8/1995 | Song et al. | |
| 5,452,511 A | 9/1995 | Chang | |
| 5,454,905 A | 10/1995 | Fogelson | |
| 5,467,032 A * | 11/1995 | Lee | 326/88 |
| 5,474,958 A | 12/1995 | Djennas et al. | |
| 5,484,274 A | 1/1996 | Neu | |
| 5,493,151 A | 2/1996 | Asada et al. | |
| 5,508,556 A | 4/1996 | Lin | |
| 5,517,056 A | 5/1996 | Bigler et al. | |
| 5,521,429 A | 5/1996 | Aono et al. | |
| 5,528,076 A | 6/1996 | Pavio | |
| 5,534,467 A | 7/1996 | Rostoker | |
| 5,539,251 A | 7/1996 | Iverson et al. | |
| 5,543,657 A | 8/1996 | Diffenderfer et al. | |
| 5,544,412 A | 8/1996 | Romero et al. | |
| 5,545,923 A | 8/1996 | Barber | |
| 5,581,122 A | 12/1996 | Chao et al. | |
| 5,592,019 A | 1/1997 | Ueda et al. | |
| 5,592,025 A | 1/1997 | Clark et al. | |
| 5,594,274 A | 1/1997 | Suetaki | |
| 5,595,934 A | 1/1997 | Kim | |
| 5,604,376 A | 2/1997 | Hamburgen et al. | |
| 5,608,267 A | 3/1997 | Mahulikar et al. | |
| 5,625,222 A | 4/1997 | Yoneda et al. | |
| 5,633,528 A | 5/1997 | Abbott et al. | |
| 5,637,922 A * | 6/1997 | Fillion et al. | 257/728 |
| 5,639,990 A | 6/1997 | Nishihara et al. | |
| 5,640,047 A | 6/1997 | Nakashima | |
| 5,641,997 A | 6/1997 | Ohta et al. | |
| 5,643,433 A | 7/1997 | Fukase et al. | |
| 5,644,169 A | 7/1997 | Chun | |
| 5,646,831 A | 7/1997 | Manteghi | |
| 5,650,663 A | 7/1997 | Parthasarathi | |
| 5,661,088 A | 8/1997 | Tessier et al. | |
| 5,665,996 A | 9/1997 | Williams et al. | |
| 5,673,479 A | 10/1997 | Hawthorne | |
| 5,683,806 A | 11/1997 | Sakumoto et al. | |
| 5,689,135 A | 11/1997 | Ball | |
| 5,696,666 A | 12/1997 | Miles et al. | |
| 5,701,034 A | 12/1997 | Marrs | |
| 5,703,407 A | 12/1997 | Hori | |
| 5,710,064 A | 1/1998 | Song et al. | |
| 5,723,899 A | 3/1998 | Shin | |
| 5,724,233 A | 3/1998 | Honda et al. | |
| 5,736,432 A | 4/1998 | Mackessy | |
| 5,745,984 A | 5/1998 | Cole, Jr. et al. | |
| 5,753,532 A | 5/1998 | Sim | |
| 5,753,977 A | 5/1998 | Kusaka et al. | |
| 5,766,972 A | 6/1998 | Takahashi et al. | |
| 5,770,888 A | 6/1998 | Song et al. | |
| 5,776,798 A | 7/1998 | Quan et al. | |
| 5,783,861 A | 7/1998 | Son | |
| 5,801,440 A | 9/1998 | Chu et al. | |
| 5,814,877 A | 9/1998 | Diffenderfer et al. | |
| 5,814,881 A | 9/1998 | Alagaratnam et al. | |
| 5,814,883 A | 9/1998 | Sawai et al. | |
| 5,814,884 A | 9/1998 | Davis et al. | |
| 5,817,540 A | 10/1998 | Wark | |
| 5,818,105 A | 10/1998 | Kouda | |
| 5,821,457 A | 10/1998 | Mosley et al. | |
| 5,821,615 A | 10/1998 | Lee | |
| 5,834,830 A | 11/1998 | Cho | |
| 5,835,988 A | 11/1998 | Ishii | |
| 5,844,306 A | 12/1998 | Fujita et al. | |
| 5,856,911 A | 1/1999 | Riley | |
| 5,859,471 A | 1/1999 | Kuraishi et al. | |
| 5,866,939 A | 2/1999 | Shin et al. | |
| 5,871,782 A | 2/1999 | Choi | |
| 5,874,784 A | 2/1999 | Aoki et al. | |
| 5,877,043 A | 3/1999 | Alcoe et al. | |
| 5,886,397 A | 3/1999 | Ewer | |
| 5,886,398 A | 3/1999 | Low et al. | |
| 5,894,108 A | 4/1999 | Mostafazadeh et al. | |
| 5,897,339 A | 4/1999 | Song et al. | |
| 5,900,676 A | 5/1999 | Kweon et al. | |
| 5,903,049 A | 5/1999 | Mori | |
| 5,903,050 A | 5/1999 | Thurairajaratnam et al. | |
| 5,909,053 A | 6/1999 | Fukase et al. | |
| 5,915,998 A | 6/1999 | Stidham et al. | |
| 5,917,242 A | 6/1999 | Ball | |
| 5,939,779 A | 8/1999 | Kim | |
| 5,942,794 A | 8/1999 | Okumura et al. | |
| 5,951,305 A | 9/1999 | Haba | |
| 5,959,356 A | 9/1999 | Oh | |
| 5,969,426 A | 10/1999 | Baba et al. | |
| 5,973,388 A | 10/1999 | Chew et al. | |
| 5,976,912 A | 11/1999 | Fukutomi et al. | |
| 5,977,613 A | 11/1999 | Takata et al. | |
| 5,977,615 A | 11/1999 | Yamaguchi et al. | |
| 5,977,630 A | 11/1999 | Woodworth et al. | |
| 5,981,314 A | 11/1999 | Glenn et al. | |
| 5,986,333 A | 11/1999 | Nakamura | |

| | | |
|---|---|---|
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,020,625 A | 2/2000 | Qin et al. |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,715 A | 7/2000 | Sawada et al. |
| 6,087,722 A | 7/2000 | Lee et al. |
| 6,100,594 A | 8/2000 | Fukui et al. |
| 6,113,473 A | 9/2000 | Costantini et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,629 B1 | 7/2001 | Niones et al. |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karmezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,369,447 B2 | 4/2002 | Mori |
| 6,369,454 B1 | 4/2002 | Chung |
| 6,373,127 B1 | 4/2002 | Baudouin et al. |
| 6,380,048 B1 | 4/2002 | Boon et al. |
| 6,384,472 B1 * | 5/2002 | Huang ........................ 257/680 |
| 6,388,336 B1 | 5/2002 | Venkateshwaran et al. |
| 6,395,578 B1 | 5/2002 | Shin et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,464,121 B2 | 10/2002 | Reijnders |
| 6,476,469 B2 | 11/2002 | Hung et al. |
| 6,476,474 B1 | 11/2002 | Hung |
| 6,482,680 B1 | 11/2002 | Khor et al. |
| 6,498,099 B1 | 12/2002 | McLellan et al. |
| 6,498,392 B2 | 12/2002 | Azuma |
| 6,507,096 B2 | 1/2003 | Gang |
| 6,507,120 B2 | 1/2003 | Lo et al. |
| 6,534,849 B1 | 3/2003 | Gang |
| 6,552,421 B2 * | 4/2003 | Kishimoto et al. ......... 257/678 |
| 6,559,525 B2 | 5/2003 | Huang |
| 6,566,168 B2 | 5/2003 | Gang |
| 6,696,752 B2 * | 2/2004 | Su et al. .................... 257/678 |
| 7,102,209 B1 * | 9/2006 | Bayan et al. ............... 257/666 |
| 2001/0008305 A1 | 7/2001 | McLellan et al. |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0038873 A1 * | 4/2002 | Hiyoshi ..................... 257/197 |
| 2002/0140061 A1 | 10/2002 | Lee |
| 2002/0140068 A1 | 10/2002 | Lee et al. |
| 2002/0163015 A1 | 11/2002 | Lee et al. |
| 2003/0030131 A1 | 2/2003 | Lee et al. |
| 2003/0073265 A1 | 4/2003 | Hu et al. |
| 2004/0089926 A1 * | 5/2004 | Hsu et al. .................. 257/678 |

FOREIGN PATENT DOCUMENTS

| | | |
|---|---|---|
| EP | 5421117 | 6/1979 |
| EP | 5950939 | 3/1984 |
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 098968 | 3/2000 |
| EP | 1032037 | 8/2000 |
| JP | 55163868 | 12/1980 |
| JP | 5745959 | 3/1982 |
| JP | 58160095 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 629639 | 1/1987 |

| | | | | | | |
|---|---|---|---|---|---|---|
| JP | 63067762 | 3/1988 | | JP | 8222682 | 8/1996 |
| JP | 63205935 | 8/1988 | | JP | 8306853 | 11/1996 |
| JP | 63233555 | 9/1988 | | JP | 98205 | 1/1997 |
| JP | 63249345 | 10/1988 | | JP | 98206 | 1/1997 |
| JP | 63316470 | 12/1988 | | JP | 98207 | 1/1997 |
| JP | 64054749 | 3/1989 | | JP | 992775 | 4/1997 |
| JP | 1106456 | 4/1989 | | JP | 9293822 | 11/1997 |
| JP | 1175250 | 7/1989 | | JP | 10022447 | 1/1998 |
| JP | 1205544 | 8/1989 | | JP | 10163401 | 6/1998 |
| JP | 1251747 | 10/1989 | | JP | 10199934 | 7/1998 |
| JP | 3177060 | 8/1991 | | JP | 10256240 | 9/1998 |
| JP | 4098864 | 9/1992 | | JP | 00150765 | 5/2000 |
| JP | 5129473 | 5/1993 | | JP | 556398 | 10/2000 |
| JP | 5166992 | 7/1993 | | JP | 2001060648 | 3/2001 |
| JP | 5283460 | 10/1993 | | JP | 200204397 | 8/2002 |
| JP | 692076 | 4/1994 | | KR | 941979 | 1/1994 |
| JP | 6140563 | 5/1994 | | KR | 9772358 | 11/1997 |
| JP | 6260532 | 9/1994 | | KR | 100220154 | 6/1999 |
| JP | 7297344 | 11/1995 | | KR | 0049944 | 6/2002 |
| JP | 7312405 | 11/1995 | | WO | 9956316 | 11/1999 |
| JP | 864634 | 3/1996 | | WO | 9967821 | 12/1999 |
| JP | 8083877 | 3/1996 | | | | |
| JP | 8125066 | 5/1996 | | | | |

* cited by examiner

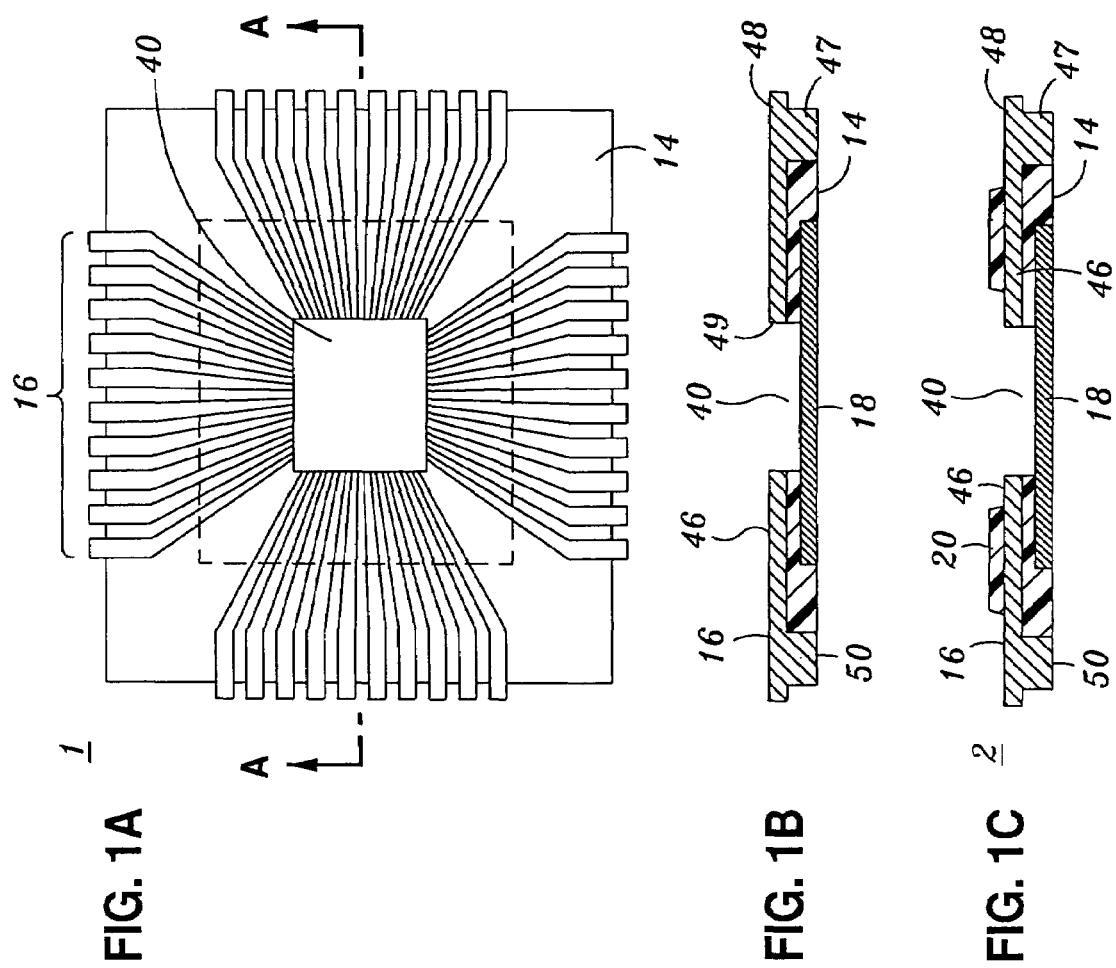

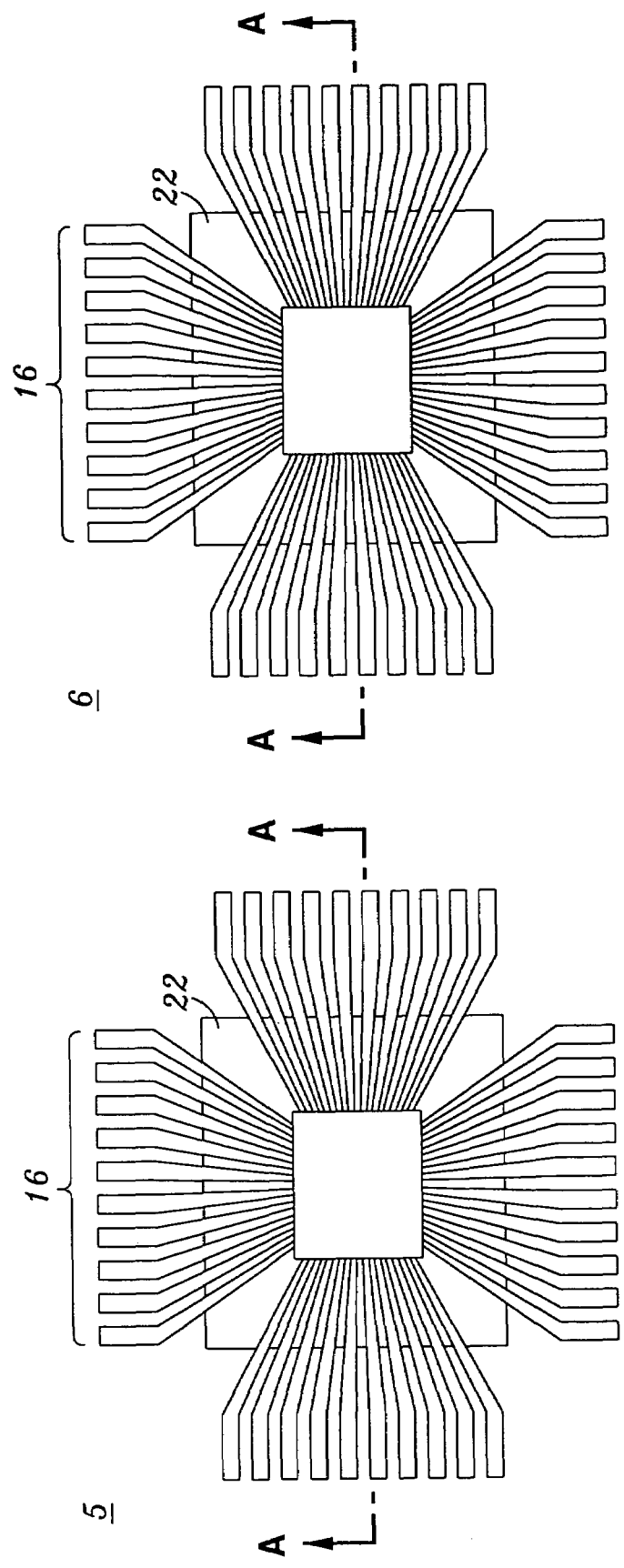
FIG. 2A
FIG. 2C
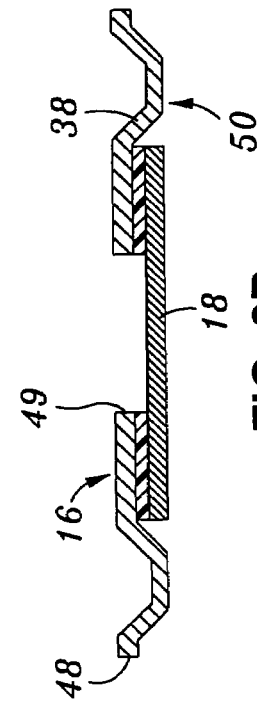
FIG. 2D
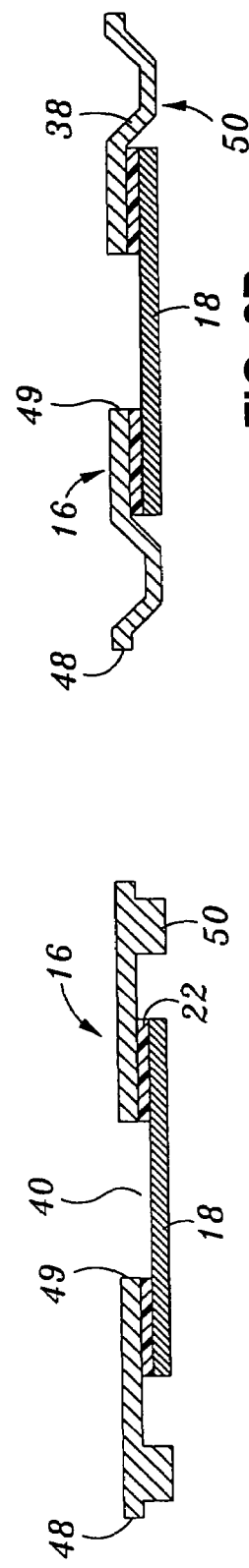
FIG. 2B

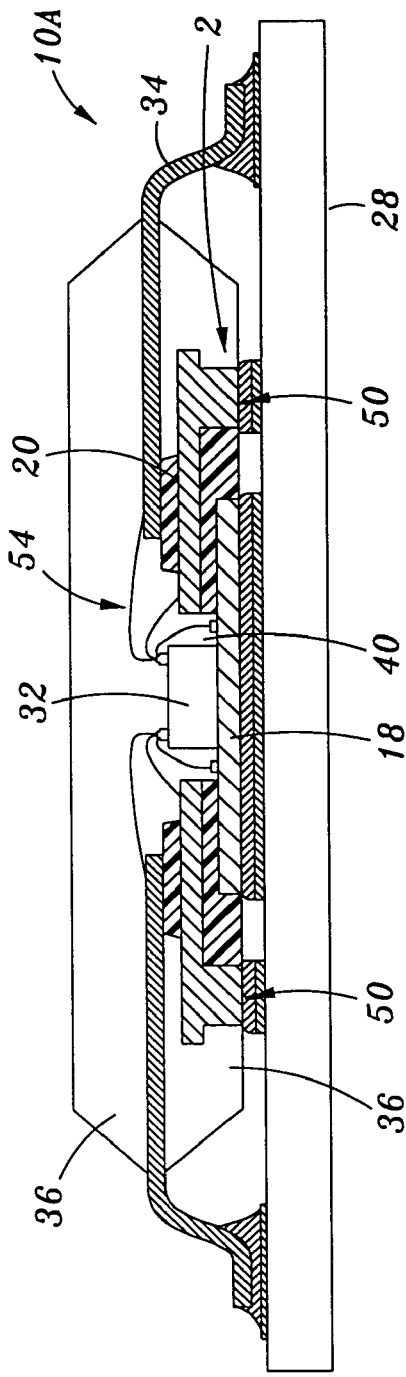
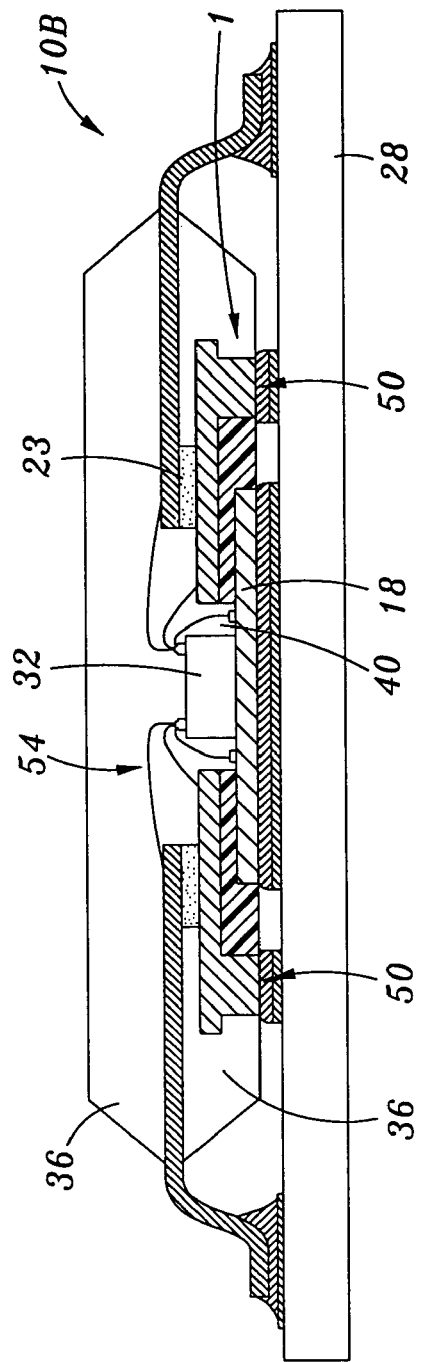
FIG. 3A
FIG. 3B

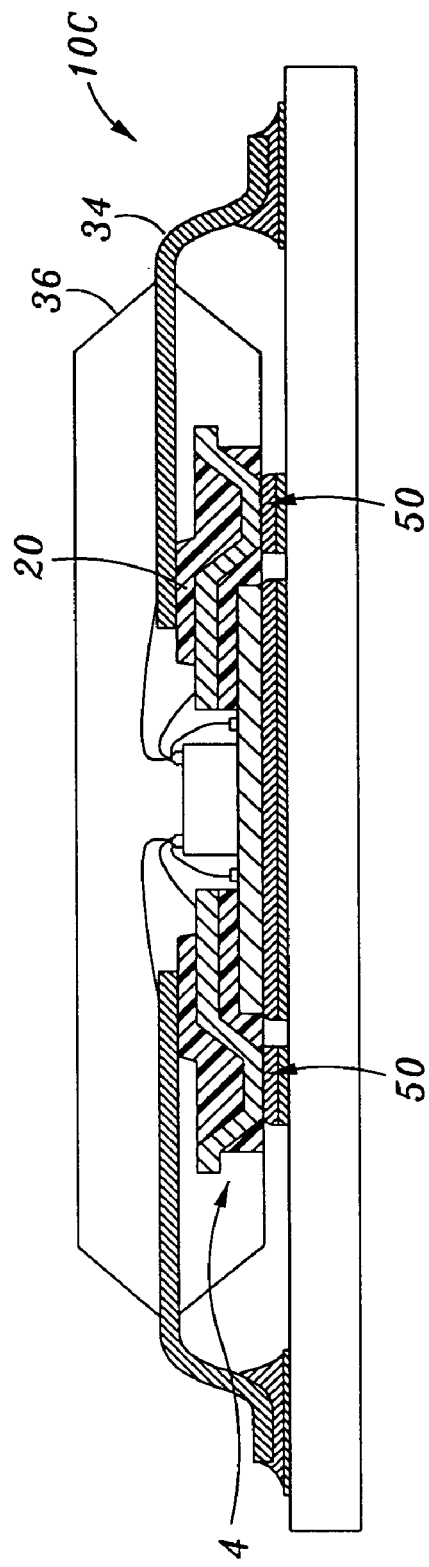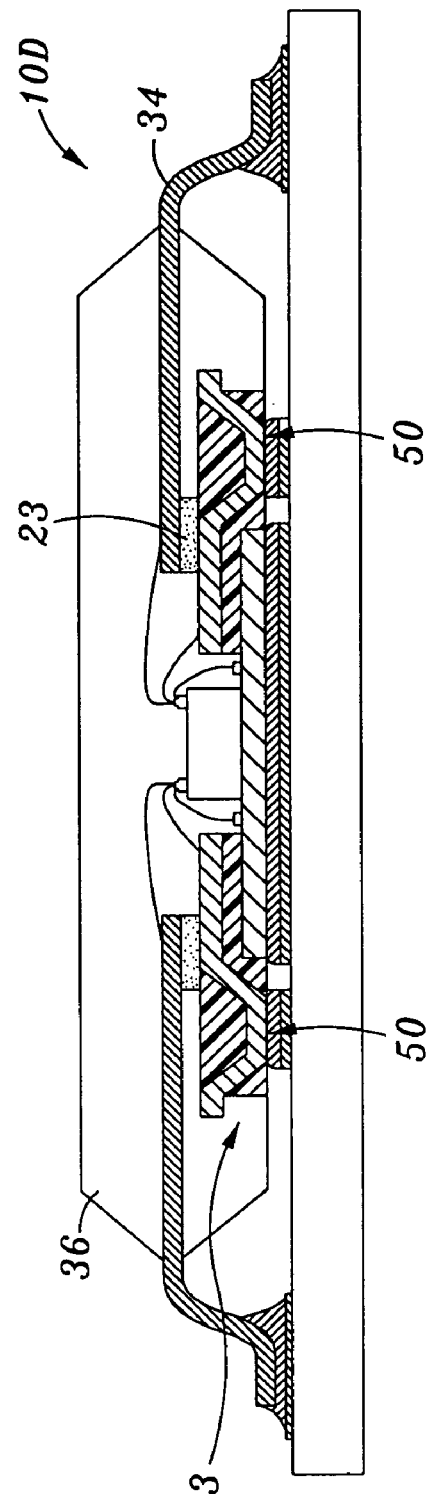
FIG. 4A
FIG. 4B

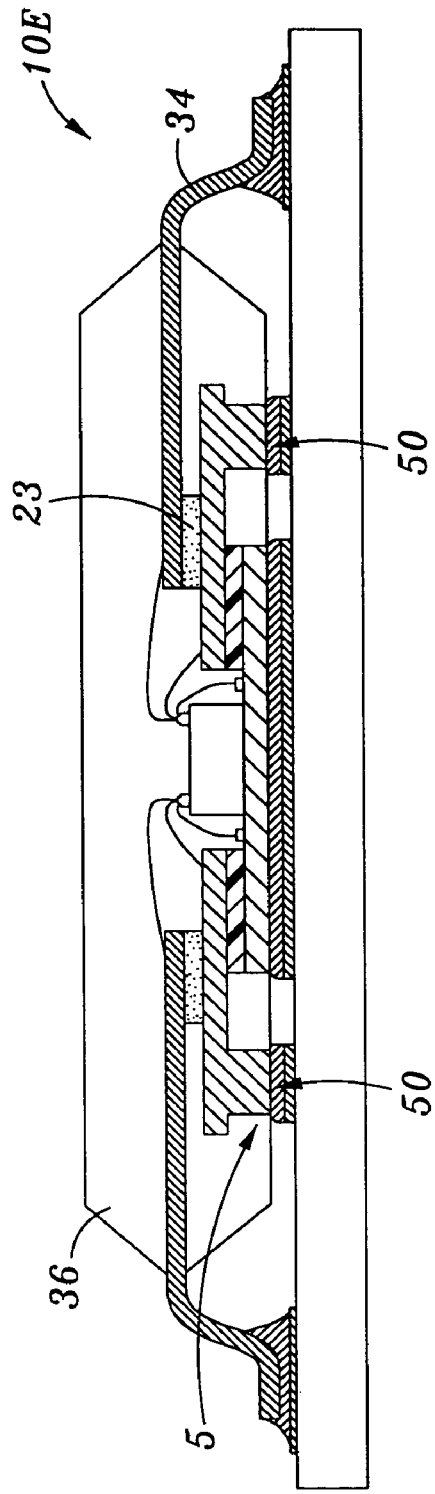
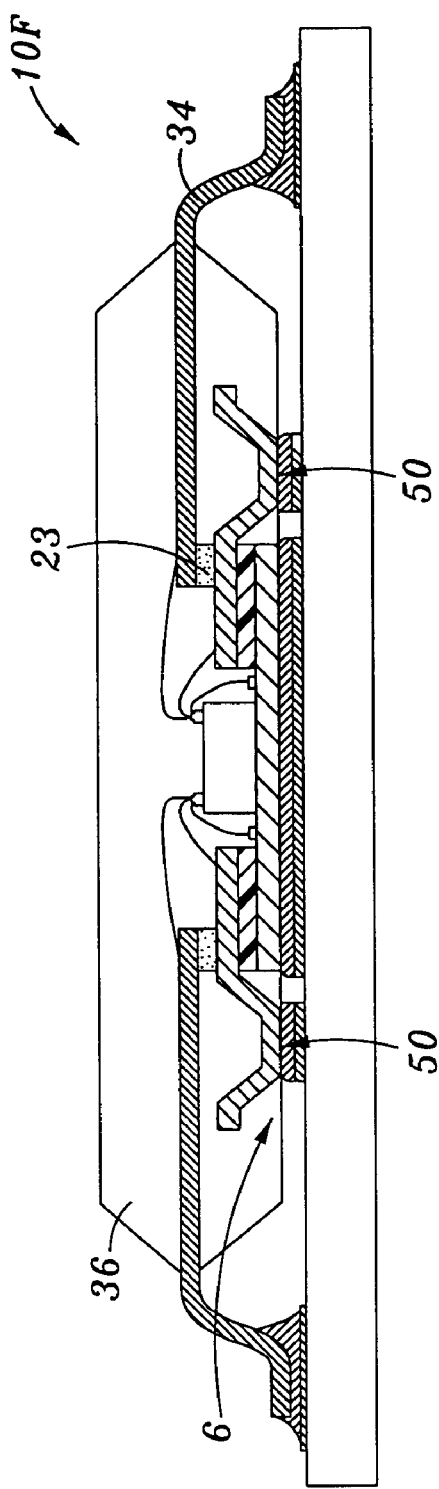
FIG. 5A
FIG. 5B

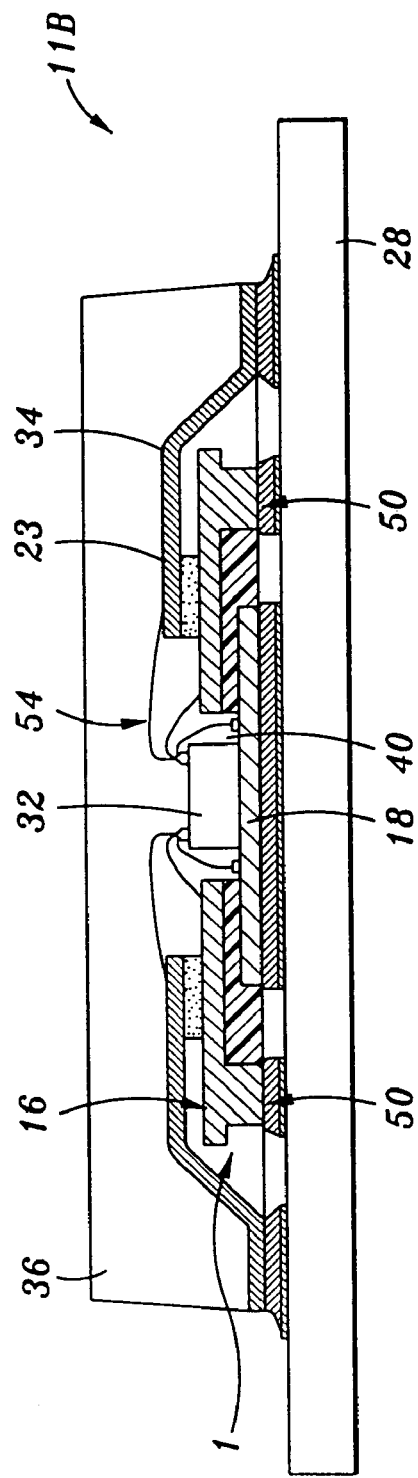
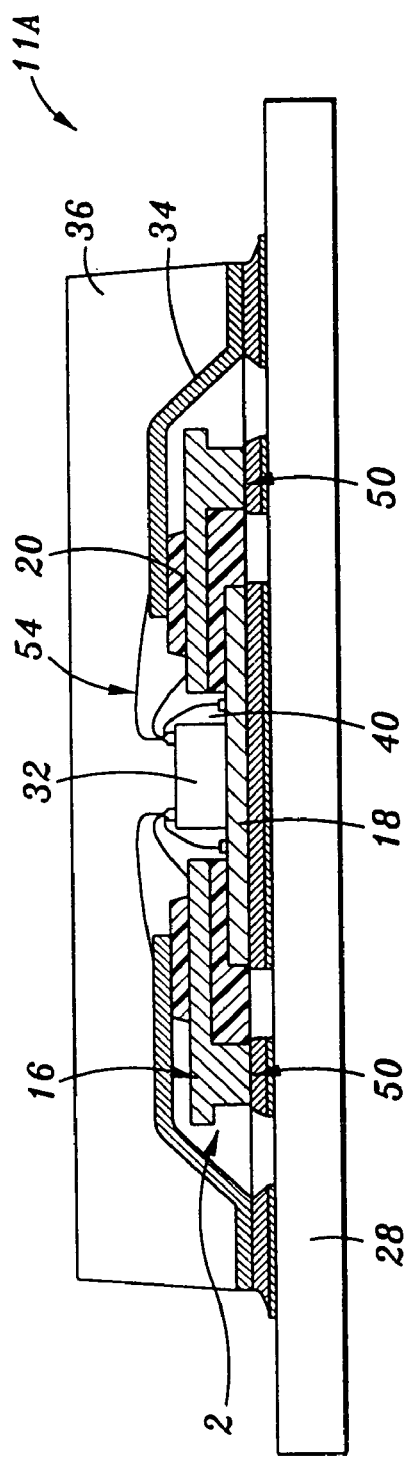

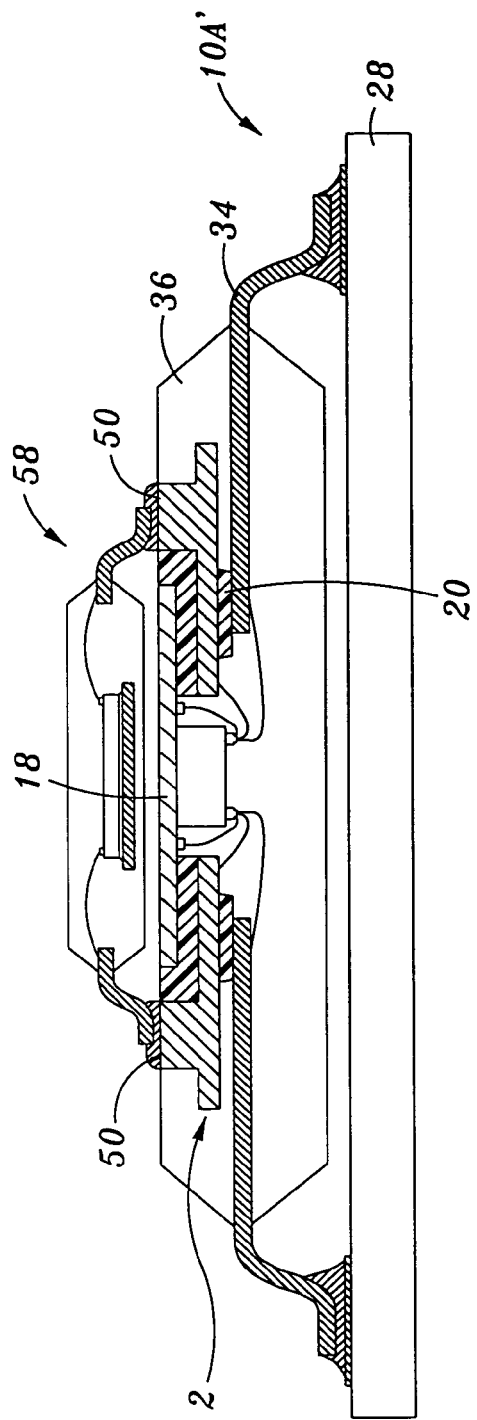
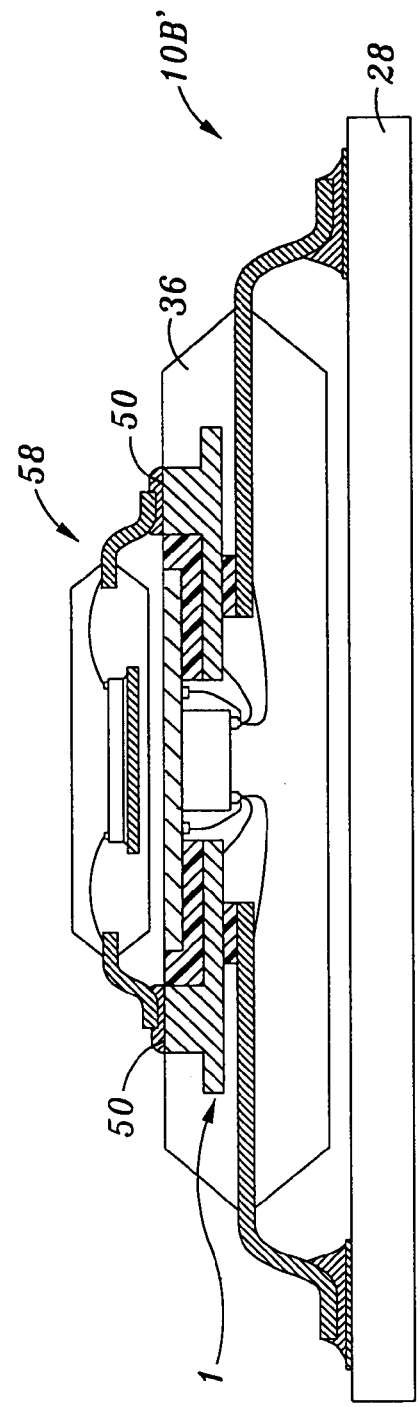
FIG. 9A
FIG. 9B

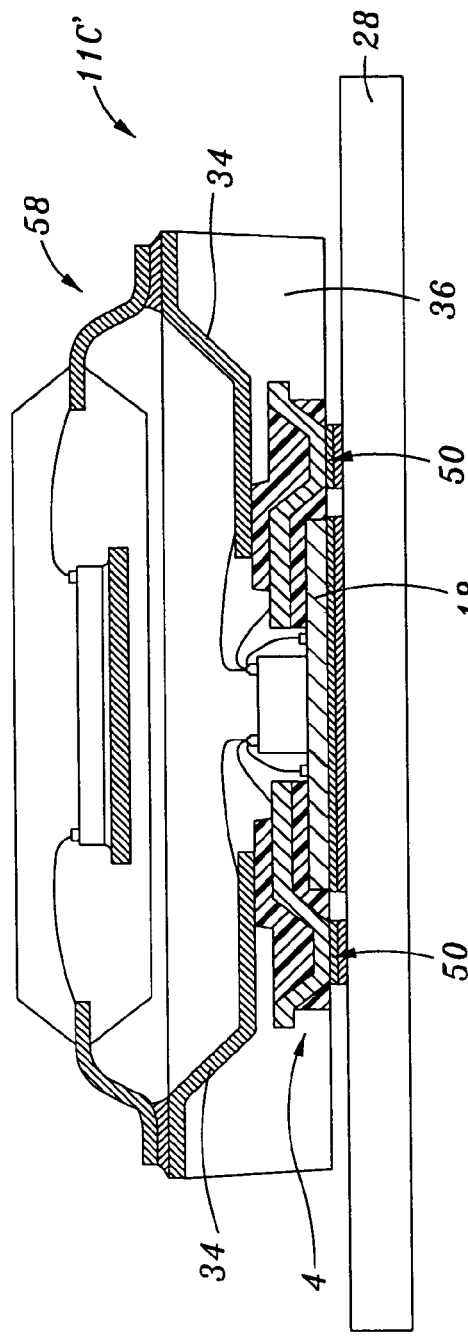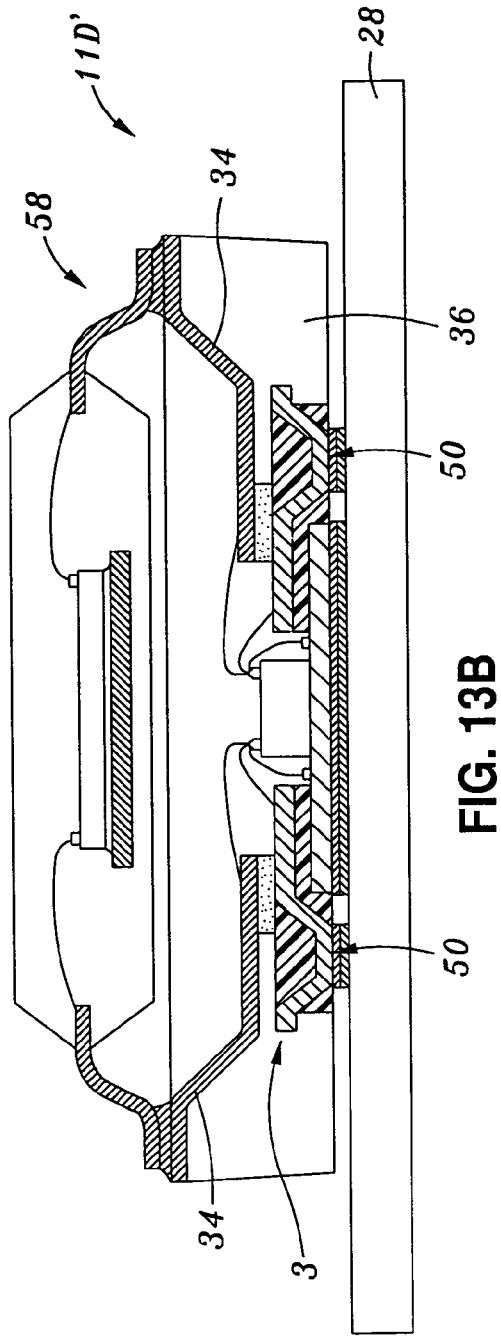
FIG. 13A
FIG. 13B

EXPOSED LEAD INTERPOSER LEADFRAME PACKAGE

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

1. Field of the Invention

The present invention relates to the field of semiconductor packaging. In particular, the present invention relates to a separate interposer structure which may be utilized in a semiconductor package to increase the total input/output capabilities of the semiconductor package.

2. Background Information

As a result of continuing improvements in semiconductor technology, the specified number of input/output (I/O) leads required to be connected to silicon dies continues to increase. Current designs of standard external lead packages, such as a quad flat package (QFP), thin quad flat package (TQFP) or thin small outline package (TSOP) are not well suited or easily adaptable for the increased number of I/O leads that current state of the art dies require. Furthermore, external lead packages are still utilized in many electronic devices and many manufacturers do not desire to completely redesign their current motherboard layouts to accommodate semiconductor packages having increased I/O specifications. Moreover, die I/O requirements are even out pacing many of the current land pattern package I/O capabilities, such as micro leadframe packages currently utilized my many electronic manufacturers.

It would be desirable to provide a device which allows a standard external lead package or a land pattern package to be retrofitted with additional exposed leads or pads/lands to accommodate modern dies having a greater number of I/O's than the original number of I/O's of which the standard external lead package or land pattern package was originally designed to accommodate.

It would also be desirable to provide a semiconductor package which maintains the current QFP, TQFP, TSOP, or micro leadframe design specifications, yet, is still able to accommodate increased I/O specifications that modern dies require.

BRIEF SUMMARY OF THE INVENTION

The aforementioned disadvantages are overcome by providing a separate interposer structure which may be integrated into a semiconductor package. Furthermore, the present invention provides a semiconductor package which integrates a separate interposer with an external lead semiconductor package or land pattern semiconductor package to increase the total input/output capabilities of the semiconductor package.

The interposer constructed in accordance with the present invention is adapted to be integrated into either external lead semiconductor packages such as a quad flat package (QFP), thin quad flat package (TQFP), or thin small outline package (TSOP). In addition to external lead packages, the interposer of the present invention may be integrated into a land pattern semiconductor package such as a micro lead frame package. When integrated into either an external lead semiconductor package or a land pattern semiconductor package, the interposer provides such package with independent exposed lands which supplement the external leads normally provided with an external lead semiconductor package and the exposed pads normally provided with a land pattern semiconductor package. The added lands provide greater design flexibility, and the capability of standardizing the package footprint without constraints on the size of the semiconductor die of the package.

The interposer of the present invention also provides the advantages of allowing standard external lead semiconductor packages and land patterns semiconductor packages to be retrofitted with the interposer to allow for the use in the package of a die having an increased number of I/O's. The ability to accommodate the increased I/O semiconductor die is facilitated by the additional lands defined by the interposer. The interposer of the present invention also cost effectively adds additional I/O paths to semiconductor packages, and creates high frequency electrical signal I/O paths on the bottom of the package body of the semiconductor package without degrading the electrical performance thereof. Furthermore, the interposer of the present invention will allow QFP's to have operational frequencies beyond five GHz in a cost effective matter. The interposer of the present invention also provides a cost effective alternative to exposed lead semiconductor packages wherein additional I/O paths are provided as a result of the implementation of a partial saw process. In this regard, by utilizing the interposer, such partial saw process may be eliminated since the interposer may be fabricated separately from the lead frame of the external lead or land pattern semiconductor package.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein:

FIG. 1A is a top view of a first exemplary embodiment of an interposer structure constructed in accordance with the present invention, referred to as a "½ etch molded" interposer;

FIG. 1B is a cross-section of FIG. 1A taken along Section A-A;

FIG. 1C is a cross-section of a second exemplary embodiment of an interposer structure constructed in accordance with the present invention, referred to as a "½ molded pedestal" interposer;

FIG. 2A is a top view of a fifth exemplary embodiment of an interposer structure constructed in accordance with the present invention, referred to as a "½ etch with tape" interposer;

FIG. 2B is a cross-section of FIG. 2A taken along Section A-A;

FIG. 2C is a top view of a six exemplary embodiment of an interposer structure constructed in accordance with the present invention, referred to as a "downset with tape" interposer;

FIG. 2D is a cross-section of FIG. 2C taken along Section A-A;

FIG. 3A is an illustrative cross-sectional view of a seventh exemplary embodiment of the present invention in which an external lead semiconductor package is provided with the "½ etch molded pedestal" interposer structure;

FIG. 3B is an illustrative cross-sectional view of an eighth exemplary embodiment of the present invention in which an external lead semiconductor package is provided with the "½ interposer structure;

FIG. 4A is an illustrative cross-sectional view of a ninth exemplary embodiment of the present invention in which an external lead semiconductor package is provided with the "downset molded pedestal" interposer structure;

FIG. 4B is an illustrative cross-sectional view of a tenth exemplary embodiment of the present invention in which an external lead semiconductor package is provided with the "downset molded" interposer structure;

FIG. 5A is an illustrative cross-sectional view of a eleventh exemplary embodiment of the present invention in which an external lead semiconductor package is provided with the "½ etch with tape" interposer structure;

FIG. 5B is an illustrative cross-sectional view of a twelfth exemplary embodiment of the present invention in which an external lead semiconductor package is provided with the "downset with tape" interposer structure;

FIG. 6A is an illustrative cross-sectional view of a thirteenth exemplary embodiment of the present invention in which a land pattern semiconductor package is provided with the "½ etch molded pedestal" interposer structure;

FIG. 6B is an illustrative cross-sectional view of a fourteenth exemplary embodiment of the present invention in which a land pattern semiconductor package is provided with the ½ etch molded" interposer structure;

FIG. 9A is an illustrative cross-sectional view of a nineteenth exemplary embodiment of the present invention in which an external lead semiconductor package is provided with an inverted "½ each molded pedestal" interposer having a second external lead semiconductor package electrically connected thereto;

FIG. 9B is an illustrative cross-sectional view of a twentieth exemplary embodiment of the present invention in which an external lead semiconductor package is provided with an inverted "½ etch molded" interposer having a second external lead semiconductor package electrically connected thereto;

FIG. 13A is an illustrative cross-sectional view of a twenty-seventh exemplary embodiment of the present invention in which a land pattern semiconductor package with the "downset molded pedestal" interposer has a second external lead semiconductor package electrically connected thereto;

FIG. 13B is an illustrative cross-sectional view of a twenty-eighth exemplary embodiment of the present invention in which a land pattern semiconductor package with the "downset molded" interposer has a second external lead semiconductor package electrically connected thereto;

Common reference numeral are used throughout the drawings and detailed description to indicate like elements.

DETAILED DESCRIPTION OF THE INVENTION

The particulars shown herein are by way of example and for purposes of illustrative discussion of the embodiments of the present invention only and are presented in the cause of providing what is believed to the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Overview of Separate Interposer Structure Embodiments

Figures 1D, 1E, 1F:
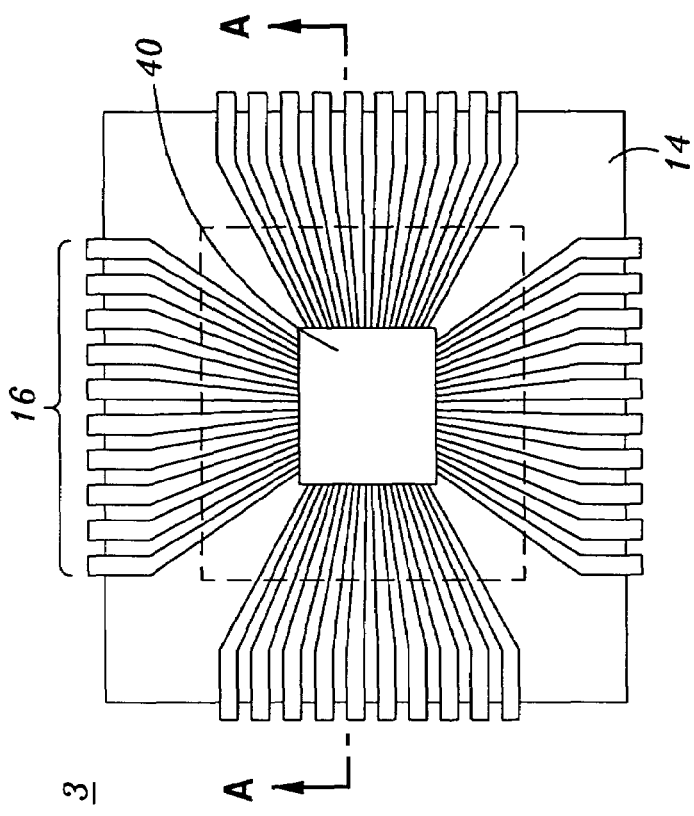
FIG. 1D is a top view of a third exemplary embodiment of an interposer structure constructed in accordance with the present invention, referred to as a "downset molded" interposer.
FIG. 1E is a cross-section of FIG. 1D taken along Section A-A.
FIG. 1F is a cross-section of a fourth exemplary embodiment of an interposer structure constructed in accordance with the present invention, referred to as a "downset molded pedestal" interposer.

FIGS. 1A-F and 2A-D illustrate numerous embodiments of a separately constructed interposer according to an aspect of the present invention. Six basic embodiments of a separate interposer (reference numerals 1, 2, 3, 4, 5 or 6) are presented for exemplary purposes, including: "½ etch molded" interposer 1 (FIG. 1A); "½ etch molded pedestal" interposer 2 (FIG. 1C); "downset molded" interposer 3 (FIG. 1D); "downset molded pedestal" interposer 4 (FIG. 1F); "½ etch with tape" interposer 5 (FIG. 2A); and "downset with tape" interposer 6 (FIG. 2B). The interposer may also take the form of numerous other embodiments having a variety of permutations and combinations of the features discussed within the specification, and therefore, the interposer of the present invention should not be limited only to the illustrated embodiments.

½-Etch Molded Embodiments

FIG. 1A depicts a first exemplary embodiment of an interposer structure, referred to as the "½ etch molded" interposer 1, according to an aspect of the present invention, and FIG. 1B is a cross-section of the same taken along Section A-A.

The "½ etch molded " interposer 1 has a thin rectangular or square shape, and is composed of three primary components: die pad 18, a plurality of interposer leads 16, and a molded dielectric 14. Interposer 1 is formed by embedding die pad 18 and the plurality of interposer leads 16 into a molded dielectric 14 which defines the body of the interposer 1. Dielectric 14 may be a typical transfer molded epoxy mold compound, or a high melting point thermoplastic such as a Liquid Crystal Polymer (LCP). As a result, die pad 18 and each of the interposer leads 16 are independently insulated from each other by the molded dielectric 14. Additionally, interposer 1 includes a cavity 40 defined by vertically oriented perimeter walls formed within a central upper region of dielectric 14. Cavity 40 exposes a portion of the top surface of the die pad 18 to allow for the attachment of a silicon die 32 thereto.

Die pad 18 has a thin, flat rectangular or square shape and is constructed from an electrically conductive material such as Cu alloy. Die pad 18 is configured and oriented such that it defines a portion of the lower surface of the interposer 1. The side edges and peripheral portions of the top surface of die pad 18 are encased or covered by dielectric 14. The entire bottom surface of die pad 18 is exposed in the dielectric 14. The totally exposed bottom surface of die pad 18 is larger in size than conventional standard die pads, and therefore, allows for greater thermal dissipation and better thermal performance.

Interposer leads 16 may be made from an electrically conductive material such as Cu alloy and are designed to create a high-speed microstrip structure for controlling impedance in which die pad 18 acts as a ground reference voltage. As shown in FIGS. 1B and 1C, each interposer lead 16 has an elongate finger portion 46 which defines an exterior terminal end 48 and an interior terminal end 49. Projecting downwardly from the finger portion 46 is a protuberance 47, the distal end of which defines a land 50. The land 50 of each lead 16 may be utilized as a solder connection terminal for soldering interposer 1 (when integrated into a semiconductor package as discussed below) to an underlying substrate such as a circuit board 28 (as shown in FIG. 3A). The top surface of the finger portion 46 adjacent the interior terminal end 49 (which terminates at the perimeter wall of the cavity 40) is adapted to receive one end of a wire bond 54 (e.g., Au wire bond), the opposite end of which extends to the die 32. The finger portions 46 of the leads 16 are arranged on the dielectric 14 in four sets, the leads 16 of each set being separated by the dielectric 14 for electrical insulation.

As is shown in FIG. 1A-1C, though the interposer leads 16 are substantially embedded within the top surface of the molded dielectric 14, the top surfaces of the finger portion 46 of the leads 16 are exposed. In each of the four sets of leads 16 included with the interposer 1, the interior terminal end 49 of the finger portion 46 of each lead 16 extends to and partially defines one of the vertically oriented perimeter walls of the cavity 40. The finger portions 46 are further arranged such that they initially spread outward in a fan-like pattern toward the outer peripheral edge of the dielectric 14. The exterior terminal ends 49 of the fingers 46 extend beyond the outer peripheral edge of the dielectric 14, as do the downwardly projecting protuberances 47 which, as indicated above, define the lands 50. From the perspective of FIG. 1A (a top plan view of the interposer 1), it is shown that the width of each lead 16 is initially thin and tapered at the interior terminal end 49 of the finger portion 46, and progressively widens to the exterior terminal end 48, those sections of the finger portions 46 defining the exterior terminal ends 48 extending in spaced, generally parallel relation to each other to a point beyond the outer peripheral edge of the dielectric 14.

FIG. 1C provides a cross-section of a second exemplary embodiment of an interposer structure, referred to as a "½ etch molded pedestal" interposer 2, according to an aspect of the present invention. The difference between interposer 1 and interposer 2 is the inclusion of a molded pedestal 20 in interposer 2. A function of molded pedestal 20 is to provide support for package leads 34 (see FIG. 3A) when interposer 2 is being integrated into a semiconductor package 8.

Molded pedestal 20 extends above the finger portions 46 of interposer leads 16 and is integrally formed with molded dielectric 14. Pedestal 20 has an inner perimeter wall and an outer perimeter wall which are interconnected by an upper surface of pedestal 20 which is substantially flat and parallel to both the top surfaces of the interposer leads 16 and the top surface of die pad 18. The inner perimeter pedestal wall is spaced outward from the perimeter walls of cavity 40 such that a portion of the top surface of the finger portion 46 of each of the interposer leads 16 is still exposed between cavity 40 and the inner perimeter pedestal wall. Also, the outer perimeter wall of the pedestal 20 is spaced inward from the outer peripheral edge of the dielectric 14 such that distal portion of the top surface of the finger portion 46 of each of the interposer leads 16 is still exposed. However, the pedestal 20 may extend to the outer peripheral edge of the dielectric 14 such that only that portion of the top surface of each finger portion 46 between the cavity 40 and the inner perimeter pedestal wall is exposed.

Downset Molded Embodiments

FIG. 1D illustrates a top view of a third exemplary embodiment of an interposer structure, referred to as a "downset molded" interposer 3, according to an aspect of the present invention, and FIG. 1E is a cross-section taken of the same along Section A-A.

The interposer 3 has features similar to those of the interposers 1, 2 above, except for the specific design of the interposer leads 16 used in interposer 3. In the third embodiment, interposer leads 16 each have a downset 38 which defines a land 50 (or exposed lead). In the "downset molded" interposer 3, the lands 50 are positioned closer toward the peripheral edge of die pad 18, as compared to the lands 50 in the interposers 1, 2. In particular, the downset 38 begins at about a thirty to forth-five degree angle downward just above the peripheral edge of die pad 18, and then straightens out so that the land 50 is generally co-planar with the bottom surface of the die pad 18. The downset 38 then returns upward at about a thirty to forty-five degree angle until it reaches the exterior terminal end 48 of the corresponding interposer lead 16. Land 50 provides an exposed lead or pad on the lower surface of the interposer 3 which may be utilized as a solder connection terminal for soldering interposer 3 to circuit board 28.

FIG. 1F illustrates a cross-section of a fourth exemplary embodiment of an interposer structure, referred to as a "downset molded pedestal" interposer 4, according to an aspect of the present invention. The difference between the third and fourth embodiments is that the "downset molded pedestal" interposer 4 includes a molded pedestal 20 which extends above the top surfaces of the finger portions 46 of interposer leads 16. The molded pedestal 20 is similar to the molded pedestal 20 previously described with respect to the second embodiment ("½ etch molded pedestal interposer 2"), and therefore, the specific details are not described again.

½-Etch With Tape Embodiments

FIG. 2A illustrates a top view of a fifth exemplary embodiment of an interposer structure, referred to as a "½ etch with tape" interposer 5, according to an aspect of the present invention, and FIG. 2B is a cross-section of the same taken along Section A-A.

In the fifth embodiment, die pad 18 and the interposer leads 16 are the same as those described in the previous embodiments; however, the "½ etch with tape" interposer 5 does not include the molded dielectric 14. Instead, interposer 5 utilizes a nonconductive adhesive tape 22 or similar material that acts as a structural member to connect the undersides of finger portions 46 of the interposer leads 16 to a peripheral portion of the top surface of die pad 18. This embodiment is ideally suited for less complex exposed lead structures that are less prone to damage or stability problems.

In particular, adhesive tape 22 is applied to the top surface of die pad 18 along the square or rectangular outer peripheral edge of die pad 18. A portion of die pad 18 is left uncovered to receive die 32. The interposer leads 16 are shaped and arranged in a similar manner as those described in the first embodiment (see "½ etch molded interposer 1"). However, in the interposer 5 the lower surfaces of the finger portions 46 of each set are affixed to the top surface of the adhesive tape 22 such that the interior terminal ends 49 of the interposer leads 16 are flush with the perimeter wall of cavity 40 defined by the adhesive tape 22. The finger portions 46 are affixed to adhesive tape 22 so as to extend in generally parallel relation to the die pad 18.

Downset With Tape Embodiments

FIG. 2C illustrates a top view of a six exemplary embodiment of an interposer structure, referred to as a "downset with tape" interposer 6, according to an aspect of the present invention, and FIG. 2D is a cross-section of the same taken along Section A-A.

The interposer 6 is very similar to the "½ etched with tape" interposer 5 above, however, interposers leads 16 have a downset 38 as in the interposers 3, 4 which provides a land 50 that functions as an exposed pad as will be described below. Thus, in the interposer 6, lands 50 are positioned closer toward the peripheral edge of the die pad 18, as compared to the lands 50 in interposers 1, 2 and 5. In particular, the downset 38 begins at about a thirty to forty-five degree angle downward just above the outer peripheral edge of die pad 18 and then straightens out so that the land 50 is generally co-planar to the bottom surface of the die pad 18. The downset 38 then returns upward at about a thirty to forty-five degree angle until it reaches the exterior terminal end 48 of interposer lead 16.

Embodiments of Interposers Integrated into Standard External Lead Packages

FIGS. 3A-B through and 5A-B illustrate various embodiments of the present invention that are semiconductor packages which include one of the interposer structures 1-6 integrated into an external lead semiconductor package such as a quad flat package (QFP), thin quad flat package (TQFP) or thin small outline package (TSOP). It is noted that interposers 1-6 may be integrated into a variety of standard external lead packages, and therefore, the present invention should not be limited only to the exemplary embodiments described below.

FIG. 3A is a cross-sectional view of a seventh exemplary embodiment of the present invention depicting an external lead semiconductor package 10A which is assembled to include the "½ etch molded pedestal" interposer 2 described above. In the semiconductor package 10A, the interposer 2 has the structural attributes described above in relation to FIG. 1C. In fabricating the semiconductor package 10A, the leadframe of the semiconductor package 10A is interfaced to the interposer 2 in a manner wherein the inner portions of the leads 34 of the leadframe are rested upon the top surface of the pedestal 20 of the interposer 2. It is contemplated that the leads 34 of the leadframe may be adhered (e.g., glued) directly to the top surface of the pedestal 20, or secured thereto via a welding or riveting procedure. Thereafter, the semiconductor die 32 is placed within the cavity 40 of the interposer 2, and attached to the exposed portion of the top surface of the die pad 18. The attachment procedure is in accordance with standard assembly processes wherein a conductive epoxy adhesive is used to attach the die 32 directly to the top surface of the die pad 18.

Thereafter, the terminals of the semiconductor die 32 are electrically connected to the interposer leads 16 and, in particular, to the top surfaces of the finger portions 46 which extend to the interior terminal ends 49 and are not covered by the pedestal 20. Such electrical connection is facilitated through the use of wire bonds 54. The wire bonds 54 are also used to electrically connect the terminals of the die 32 to the inner portions of the leads 34, and may also be optionally used to electrically connect the die 32 directly to the die pad 18 of the interposer 2. A conventional bonding process, such as Au thermosonic wire bonding methods, may be employed in the fabrication of the external lead semiconductor package 10A. Those of ordinary skill in the art will recognize that the wire bonds 54 may be electrically connected to the interposer leads 16, leads 34, and/or die pad 18 in any number or in any combination without departing from the spirit and scope of the present invention. Once the semiconductor die 32 has been electrically connected to the interposer 2 and leadframe engaged thereto, the interposer 2, die 32, and leadframe are partially covered or encapsulated by a plastic compound which, upon hardening, forms a package body 36 of the semiconductor package 10A. As seen in FIG. 3A, the package body 36 is formed in a manner wherein the lands 50 defined by the interposer leads 16 of the interposer 2 and the bottom surface of the die pad 18 of the interposer 2 are each exposed in and substantially flush with the bottom surface defined by the package body 36. The leads 34 of the leadframe of the semiconductor package 10A protrude from respective side surfaces of the package body 36. Also exposed within the bottom surface of the package body 36 is a portion of the dielectric 14 of the interposer 2. The die 32 and wire bonds 54 are completely covered or encapsulated by the package body 36.

Subsequent to the formation of the package body 36, the dambar of the leadframe which is disposed outboard of the package body 36 and interconnects the leads 34 to each other is singulated or removed from the leads 34, thus effectively electrically isolating the leads 34 from each other. Thereafter, the leads 34 may be subjected to a bending operation to impart the gull-wing configuration thereto as shown in FIG. 3A.

Figure 10A:
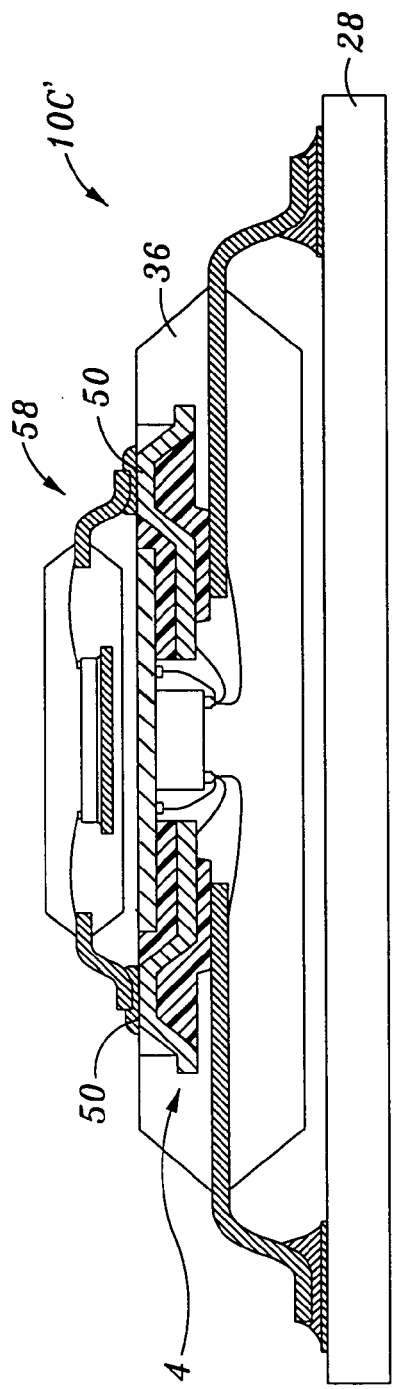
FIG. 10A is an illustrative cross-sectional view of a twenty-first exemplary embodiment of the present invention in which an external lead semiconductor package is provided with an inverted "downset molded pedestal" interposer having a second external lead semiconductor package electrically connected thereto.

The completed semiconductor package 10A, by virtue of the inclusion of the interposer 2 therein, includes not only the terminals defined by the exposed leads 34, but also those defined by the exposed lands 50 of the interposer leads 16 of the interposer 2. Another terminal is defined by the exposed bottom surface of the die pad 18. As seen in FIG. 10A, the distal ends of the leads 34, lands 50, and die pad 18 may each be connected to an underlying substrate such as the printed circuit board 28 for purposes of providing signal routing or, in the case of the die pad 18, a ground connection or medium for enhanced thermal dissipation.

FIG. 3B is a cross-sectional view of an eighth exemplary embodiment of the present invention in which an exposed lead semiconductor package 10B is provided with the "½ etch molded" interposer 1 shown and described in relation to FIGS. 1A and 1B. In the semiconductor package 10B, adhesive tape 23 is substituted for the pedestal 20 of the interposer 2. In this regard, the fabrication process associated with the semiconductor package 10B of the eighth embodiment is substantially identical to that described above in relation to the semiconductor package 10A, except that the inner portions of the leads 34 of the leadframe in the semiconductor package 10B are adhered to the adhesive tape 23, as opposed to being interfaced to the pedestal 20 of the interposer 2 as described in relation to FIG. 10A. In fabricating the semiconductor package 10B, the adhesive tape 23 should be sufficiently thick to ensure a low coupling capacitance between the leads 34 of the leadframe and the interposer leads 16 of the interposer 1.

FIGS. 4A, 4B, 5A and 5B illustrate external lead semiconductor packages 10C, 10D, 10E and 10F, respectively, constructed in accordance with ninth through twelfth exemplary embodiments of the present invention. Because the semiconductor packages 10C, 10D, 10E and 10F are fabricated through an assembly process substantially similar to that described above in relation to the semiconductor packages 10A, 10B, only an overview of the overall configuration of the ninth through twelfth embodiments is discussed below.

FIG. 4A is a cross-sectional view of the ninth exemplary embodiment of the present invention in which the external lead semiconductor package 10C is provided with the "downset molded pedestal" interposer 4 as an alternative to the "½ etch molded pedestal" interposer 2 shown and described in relation to FIG. 3A. In the semiconductor package 10C, the lands 50 defined by the downsets 38 of the interposer leads 16 of the interposer 4 are exposed in and substantially flush with the bottom surface of the package body 36. Also exposed in the bottom surface of the package body 36 is the bottom surface of the die pad 18 of the interposer 4, as well as portions of the dielectric 14 thereof.

FIG. 4B is a cross-sectional view of the tenth exemplary embodiment of the present invention in which the semiconductor package 10D is provided with the "downset molded" interposer 3 shown and described in relation to FIGS. 1D and 1E, as an alternative to the interposer 4 shown in FIG. 4A. As in the semiconductor package 10B described above in relation to FIG. 3B, the leads 34 of the semiconductor package 10D are interfaced to the interposer 3 through the use of the adhesive tape 23.

FIG. 5A is a cross-sectional view of the eleventh exemplary embodiment of the present invention in which the semiconductor package 10E is fabricated to include the "½ etch with tape" interposer 5 previously shown and described in relation to FIGS. 2A and 2B. In the semiconductor package 10E, adhesive tape 23 is also used to cooperatively engage the leads 34 of the leadframe included in the semiconductor package 10E to the top surfaces of the finger portions 46 of the interposer leads 16 included in the interposer 5.

FIG. 5B is a cross-sectional view of the twelfth exemplary embodiment of the present invention in which the semiconductor package 10F is assembled to include the "downset with tape" interposer 6 shown and described in relation to FIGS. 2C and 2D, as an alternative to the "½ etch with tape" interposer 5 included in the semiconductor package 10E as shown in FIG. 5A. In the semiconductor package 10F, adhesive tape 23 is also used to cooperatively engage the leads 34 to the top surfaces of the finger portions 46 of the interposer leads 16 included in the interposer 6.

Embodiments of Interposers Integrated into Land Pattern Packages

FIGS. 6A-B through 8A-B illustrate various embodiments of the present invention that are semiconductor packages which include one of the interposer structures 1-6 integrated into a land pattern semiconductor package, such as a microleadframe package. It is noted that the interposers 1-6 may be integrated into a variety of land pattern packages, and therefore, the present invention should not be limited only to the exemplary embodiments described below.

FIG. 6A is a cross-sectional view of a thirteenth exemplary embodiment of the present invention depicting a land pattern semiconductor package 11A which is assembled to include the "½ etch molded pedestal" interposer 2 described above. In the semiconductor package 11A, the interposer 2 has the structural attributes described above in relation to FIG. 1C. The process of fabricating the semiconductor package 11A is substantially similar to that described above in relation to the fabrication of the semiconductor package 10A shown in FIG. 3A. In this regard, the primary distinction between the semiconductor packages 10A, 11A lies in the configuration of the package body 36 of the semiconductor package 11A in comparison to the package body 36 of the semiconductor package 10A. More particularly, in the semiconductor package 11A, the leads 34 of the leadframe thereof are also cooperatively engaged to the top surface of the pedestal 20 of the interposer 2. The package body 36 of the semiconductor package 11A is formed such that the bottom surfaces of the distal portions of the leads 34 of the leadframe are exposed in and substantially flush with the bottom surface of the package body 36. This is in contrast to the relationship between the leads 34 and the package body 36 in the semiconductor package 10A wherein the outer portions of the leads 34 protrude from respective side surfaces of the package body 36 in the semiconductor package 10A. The absence of any portion of the leads 34 protruding from the package body 36 in the semiconductor package 11A imparts thereto the structural attributes of a land pattern semiconductor package. Once the package body 36 of the semiconductor package 11A has been completely formed, any portion of the leadframe protruding from the package body 36 is singulated or removed, thus resulting in the bottom surfaces of the distal portions of the leads 34 being exposed in and substantially flush with the bottom surface of the package body 36, and the distal end of each lead 34 being exposed in and substantially flush with a respective side surface of the package body 36.

Figure 11A:
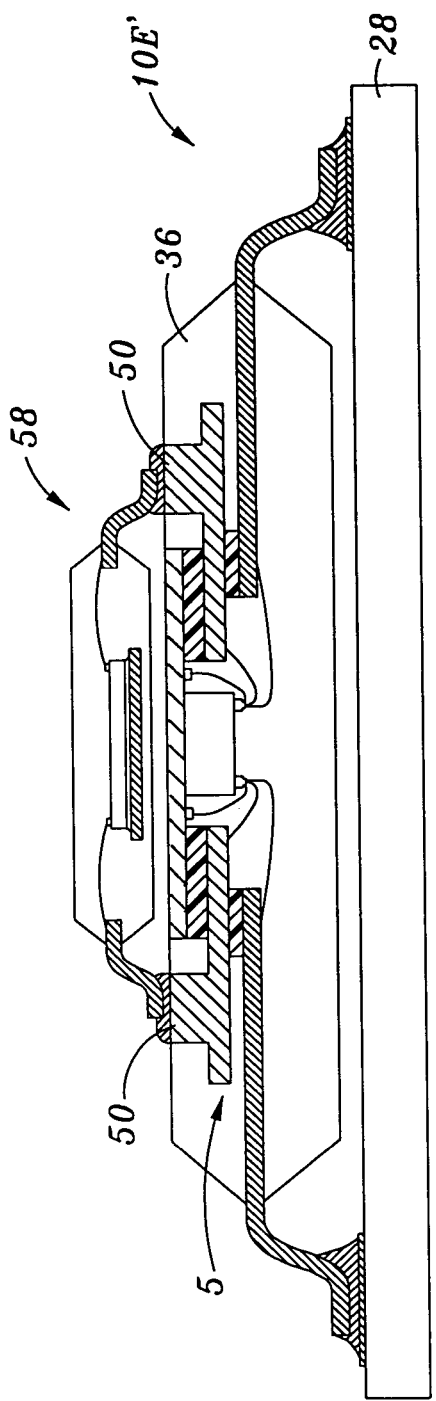
FIG. 11A is an illustrative cross-sectional view of a twenty-third exemplary embodiment of the present invention in which an external lead semiconductor package is provided with an inverted "½ with tape" interposer having a second external lead semiconductor package electrically connected thereto.
Figure 11B:
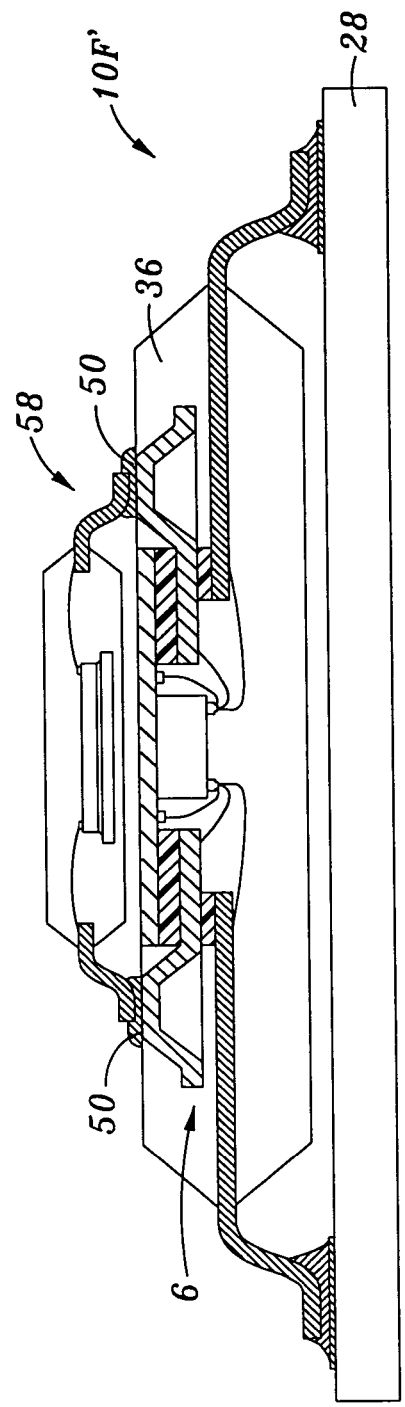
FIG. 11B is an illustrative cross-sectional view of a twenty-fourth exemplary embodiment of the present invention in which an external lead semiconductor package is provided with an inverted "downset with tape" interposer having a second external lead semiconductor package electrically connected thereto.

FIG. 11B is a cross-sectional view of a fourteenth exemplary embodiment of the present invention in which a land pattern semiconductor package 11B is provided with the "½ etch molded" interposer 1 shown and described in relation to FIGS. 1A and 1B. In the semiconductor package 11B, adhesive tape 23 is substituted for the pedestal 20 of the interposer 2 shown in FIG. 11A. In this regard, the fabrication process associated with the semiconductor package 11B of the fourteenth embodiment is substantially identical to that described above in relation to the semiconductor package 11A, except that the inner portions of the leads 34 of the leadframe in the semiconductor package 11B are adhered to the adhesive tape 23, as opposed to being interfaced to the pedestal 20 of the interposer 2 as described in relation to FIG. 11A.

FIGS. 7A, 7B, 8A and 8B illustrate land pattern semiconductor packages 11C, 11D, 11E and 11F, respectively, constructed in accordance with fifteenth through eighteenth embodiments of the present invention. Because the semiconductor packages 11C, 11D, 11E and 11F are fabricated through an assembly process substantially similar to that described above in relation to the semiconductor packages 11A, 11B, only an overview of the overall configuration of the fifteenth through eighteenth embodiments is discussed below.

Figure 7A:
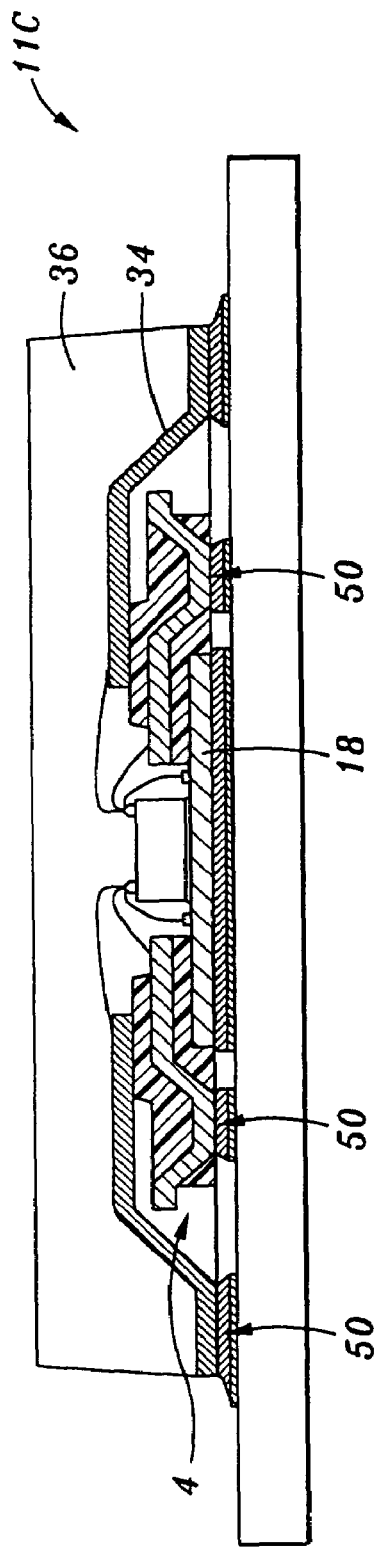
FIG. 7A is an illustrative cross-sectional view of a fifteenth exemplary embodiment of the present invention in which a land pattern semiconductor package is provided with the "downset molded pedestal" interposer structure.

FIG. 7A is a cross-sectional view of the fifteenth exemplary embodiment of the present invention in which the land pattern semiconductor package 11C is provided with the "downset molded pedestal" interposer 4 as an alternative to the "½ etch molded pedestal" interposer 2 shown and described in relation to FIG. 11A. In the semiconductor package 11C, the lands 50 defined by the downsets 38 of the interposer leads 16 of the interposer 4 are exposed in and substantially flush with the bottom surface of the package body 36. Also exposed in the bottom surface of the package body 36 is the bottom surface of the die pad 18 of the interposer 4, as well as portions of the dielectric 14 thereof.

Figure 7B:
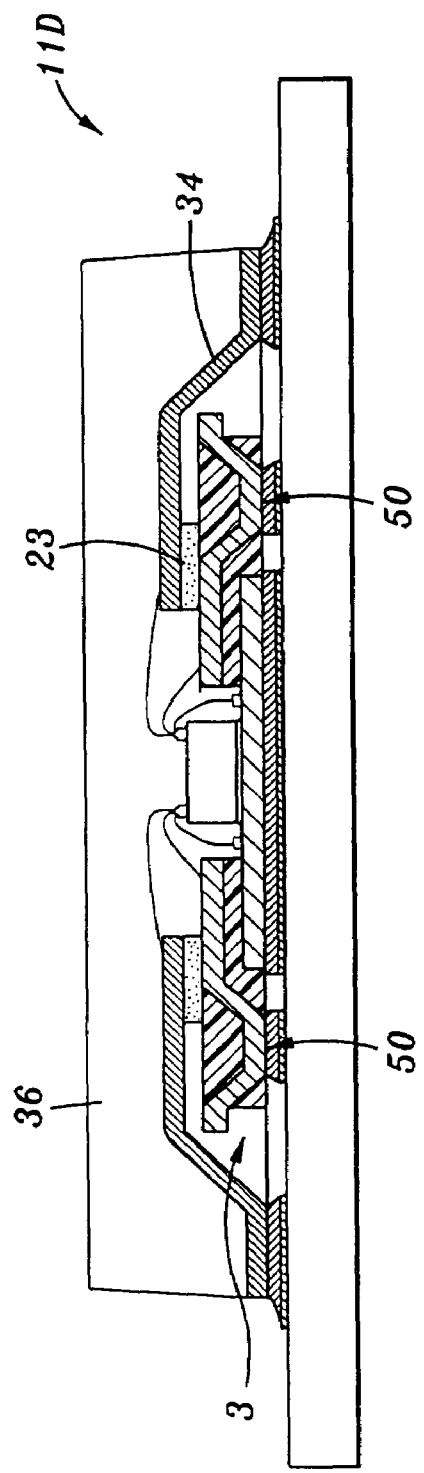
FIG. 7B is an illustrative cross-sectional view of a sixteenth exemplary embodiment of the present invention in which a land pattern semiconductor package is provided with the "downset molded" interposer structure.

FIG. 7B is a cross-sectional view of the sixteenth exemplary embodiment of the present invention in which the land pattern semiconductor package 11D is provided with the "downset molded" interposer 3 shown and described in relation to FIGS. 1D and 1E, as an alternative to the interposer 4 shown in FIG. 7A. As in the semiconductor package 11B described above in relation to FIG. 6B, the leads 34 of the semiconductor package 11D are interfaced to the interposer 3 through the use of the adhesive tape 23.

Figure 8A:
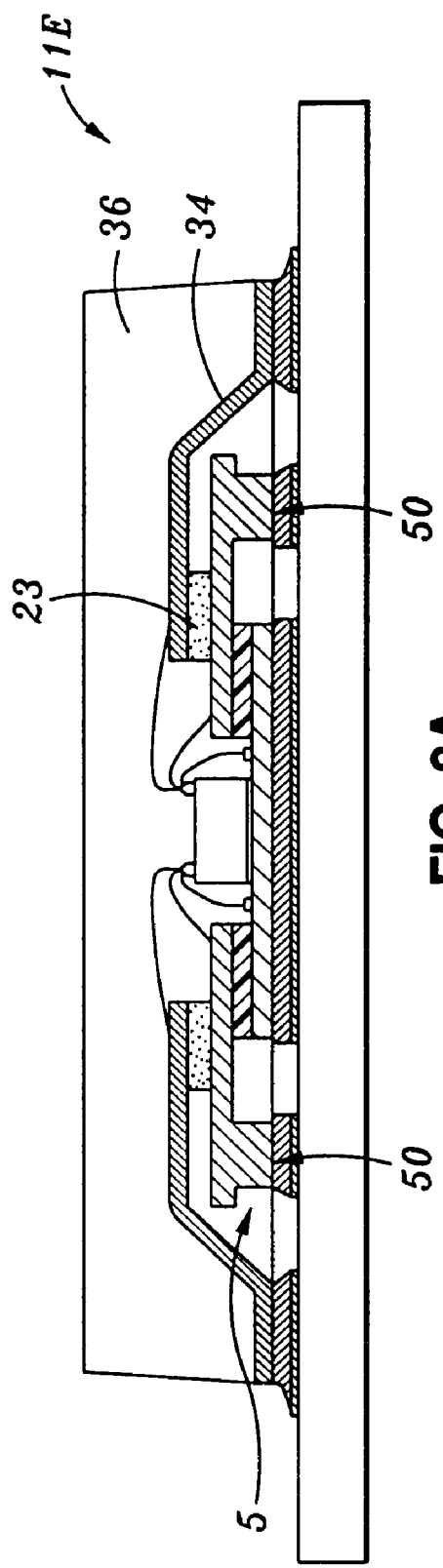
FIG. 8A is an illustrative cross-sectional view of a seventeenth exemplary embodiment of the present invention in which a land pattern semiconductor package is provided with the "½ etch with tape" interposer structure.

FIG. 8A is a cross-sectional view of the seventeenth exemplary embodiment of the present invention in which the land pattern semiconductor package 11E is fabricated to include the "½ etch with tape" interposer 5 previously shown and described in relation to FIGS. 2A and 2B. In the semiconductor package 11E, adhesive tape 23 is also used to cooperatively engage the leads 34 of the leadframe included in the semiconductor package 11E to the top surfaces of the finger portions 46 of the interposer leads 16 included in the interposer 5.

Figure 8B:
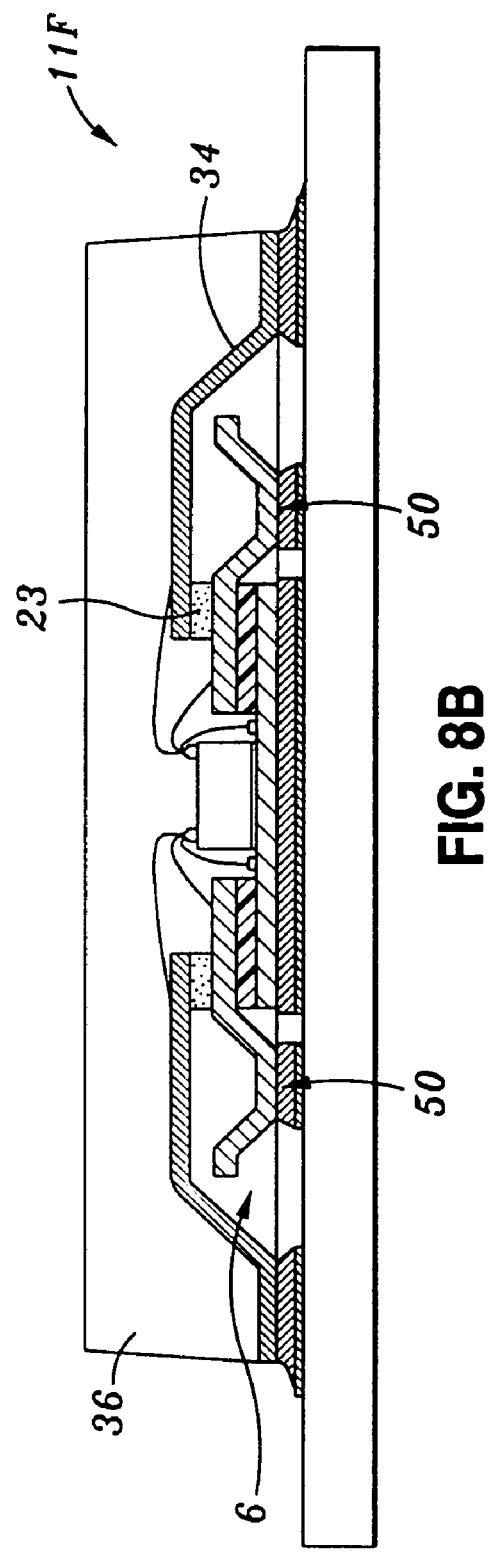
FIG. 8B is an illustrative cross-sectional view of an eighteenth exemplary embodiment of the present invention in which a land pattern semiconductor package is provided with the "downset with tape" interposer structure.

FIG. 8B is a cross-sectional view of the eighteenth exemplary embodiment of the present invention in which the land pattern semiconductor package 11F is assembled to include the "downset with tape" interposer 6 shown and described in relation to FIGS. 2C and 2D, as an alternative to the "½ etch with tape" interposer 5 included in the semiconductor package 11E as shown in FIG. 8A. In the semiconductor package 11F, adhesive tape 23 is also used to cooperatively engage the leads 34 to the top surfaces of the finger portions 46 of the interposer leads 16 included in the interposer 6.

Embodiments of Stacked External Lead Packages Including Interposers

FIGS. 9A-B through 11A-B illustrate various embodiments of the present invention wherein external lead semiconductor packages assembled to include the interposers 1-6 described above have a second, standard external lead semiconductor package stacked thereon and electrically connected thereto. As will be discussed in more detail below, in each of the embodiments of the "stacked" external lead semiconductor packages, the interposers 1-6 are inverted as compared to the showings in prior embodiments.

FIG. 9A is a cross-sectional view of a nineteenth exemplary embodiment of the present invention comprising a stacked semiconductor package arrangement including an external lead semiconductor package 10A' which bears close similarity to the structural and functional attributes of the semiconductor package 10A shown in FIG. 3A. The semiconductor package 10A' includes the interposer 2 described above. However, in contrast to the orientation of the interposer 2 in the semiconductor package 10A, the interposer 2 in the semiconductor package 10A' is inverted such that the top surfaces of the leads 34 of the leadframe in the semiconductor package 10A' are placed against the pedestal 20 of the interposer 2 thereof. This is in contrast to the semiconductor package 10A described above wherein the bottom surfaces or undersides of the leads 34 thereof are rested against the pedestal 20 of the corresponding interposer 2. Due to the interposer 2 in the semiconductor package 10A' being inverted, the lands 50 and bottom surface of the die pad 18 of the interposer 2 in the semiconductor package 10A' are exposed in the top surface (rather than the bottom surface) of the package body 36 thereof. As a result, when the leads 34 of the semiconductor package 10A' are attached to an underlying substrate such as a printed circuit board 28, the exposed lands 50 in the top surface of the package body 36 provide connection terminals which allow for the electrical connection of a second external lead semiconductor package 58 to the semiconductor package 10A' in the manner shown in FIG. 9A. In this regard, the distal ends of the leads of the second, uppermost semiconductor package 58 are brought into contact with and electrically connected to respective ones of the lands 50 of the interposer 2 of the semiconductor package 10A', the lands 50 being exposed in and substantially flush with the top surface of the package body 36 of the semiconductor package 10A' as indicated above.

FIG. 9B is a cross-sectional view of a twentieth exemplary embodiment of the present invention which shows a stacked semiconductor package arrangement similar to that shown in FIG. 9A, except that the semiconductor package 10A' shown in FIG. 9A is substituted with the semiconductor package 10B' shown in FIG. 9B, the semiconductor package 10B' including the above-described interposer 1 as an alternative to the interposer 2 included in the semiconductor package 10A'. In this regard, the semiconductor package 10B' itself bears substantial similarity to the semiconductor package 10B shown and described above in relation to FIG. 3B, except that the interposer 1 in the semiconductor package 10B' is inverted in the same manner the interposer 2 is inverted in the semiconductor package 10A'. The inversion of the interposer 1 in the semiconductor package 10B' facilitates the exposure of the lands 50 of the interposer 1 in the top surface of the package body 36 of the semiconductor package 10B', thus allowing for the electrical connection of the second external lead semiconductor package 58 thereto.

FIG. 10A is a cross-sectional view of a twenty-first exemplary embodiment of the present invention which shows a stacked semiconductor arrangement similar to that shown in FIG. 9A except that the semiconductor package 10C' shown in FIG. 10A includes the above-described interposer 4 as an alternative to the interposer 2 included in the semiconductor package 10A'. In this regard, the semiconductor package 10C' bears substantial similarity to the semiconductor package 10C shown in FIG. 4A, except that the interposer 4 in the semiconductor package 10C' is inverted in the same manner the interposer 2 is inverted in the semiconductor package 10A'. The inversion of the interposer 4 in the semiconductor package 10C' facilitates the exposure of the lands 50 of the interposer 4 in the top surface of the package body 36 of the semiconductor package 10C', thus allowing for the electrical connection of the second external lead semiconductor package 58 thereto.

Figure 10B:
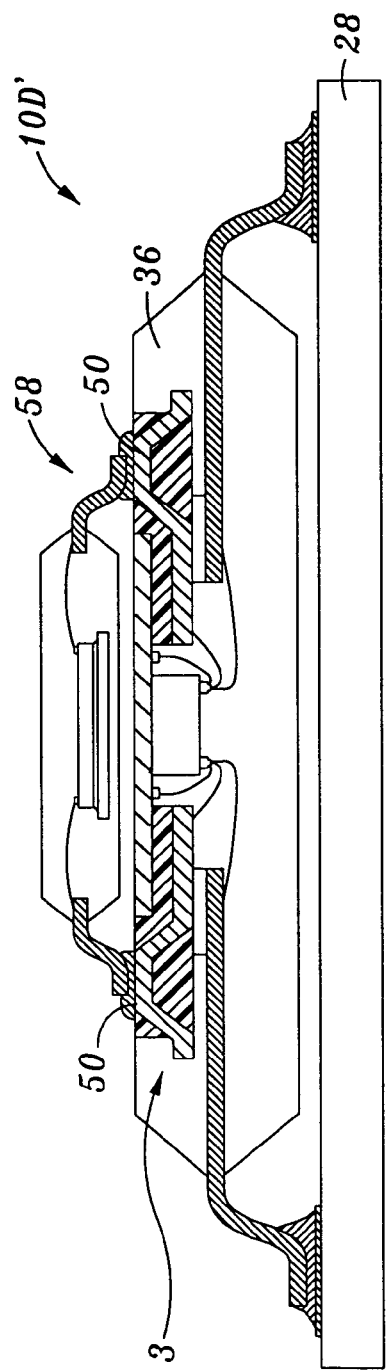
FIG. 10B is an illustrative cross-sectional view of a twenty-second exemplary embodiment of the present invention in which an external lead semiconductor package is provided with an inverted "downset molded" interposer having a second external lead semiconductor package electrically connected thereto.

FIG. 10B is a cross-sectional view of a twenty-second exemplary embodiment of the present invention which shows a stacked semiconductor arrangement also similar to that shown in FIG. 9A, except that the semiconductor package 10D' shown in FIG. 10B includes the above-described interposer 3 as an alternative to the interposer 2 included in the semiconductor package 10A'. In this regard, the semiconductor package 10D' itself bears substantial similarity to the semiconductor package 10D shown and described above in relation to FIG. 4B, except that the interposer 3 in the semiconductor package 10D' is inverted in the same manner the interposer 2 is inverted in the semiconductor package 10A'. The inversion of the interposer 3 in the semiconductor package 10D' facilitates the exposure of the lands 50 of the interposer 3 in the top surface of the package body 36 of the semiconductor package 10D', thus allowing for the electrical connection of the second external lead semiconductor package 58 thereto.

FIG. 11A is a cross-sectional view of a twenty-third exemplary embodiment of the present invention, which shows a stacked semiconductor arrangement also similar to that shown in FIG. 9A, except that the semiconductor package 10E' shown in FIG. 11A includes the above-described interposer 5 as an alternative to the interposer 2 included in the semiconductor package 10A'. In this regard, the semiconductor package 10E' itself bears substantial similarity to the semiconductor package 10E shown and described above in relation to FIG. 5A, except that the interposer 5 in the semiconductor package 10E' is inverted in the same manner the interposer 2 is inverted in the semiconductor package 10A'. The inversion of the interposer 5 in the semiconductor package 10E' facilitates the exposure of the lands 50 of the interposer 5 in the top surface of the package body 36 of the semiconductor package 10E', thus allowing for the electrical connection of the second external lead semiconductor package 58 thereto.

FIG. 11B is a cross-sectional view of a twenty-fourth exemplary embodiment of the present invention which shows a stacked semiconductor arrangement similar to that shown in FIG. 9A, except that the semiconductor package 10F' shown in FIG. 11B includes the above-described interposer 6 as an alternative to the interposer 2 included in the semiconductor package 10A'. In this regard, the semiconductor package 10F' itself bears substantial similarity to the semiconductor package 10F shown and described above in relation to FIG. 5B, except that the interposer 6 in the semiconductor package 10F' is inverted in the same manner the interposer 2 is inverted in the semiconductor package 10A'. The inversion of the interposer 6 in the semiconductor package 10F' facilitates the exposure of the lands 50 of the interposer 6 in the top surface of the package body 36 of the semiconductor package 10F', thus allowing for the electrical connection of the second external lead semiconductor package 58 thereto.

Embodiments of Stacked Land Pattern Packages Including Interposers

FIGS. 12A-B through 14A-B illustrate various embodiments of the present invention wherein land pattern semiconductor packages assembled to include the interposers 1-6 described above have a second, standard external lead semiconductor package stacked thereon and electrically connected thereon.

Figure 12A:
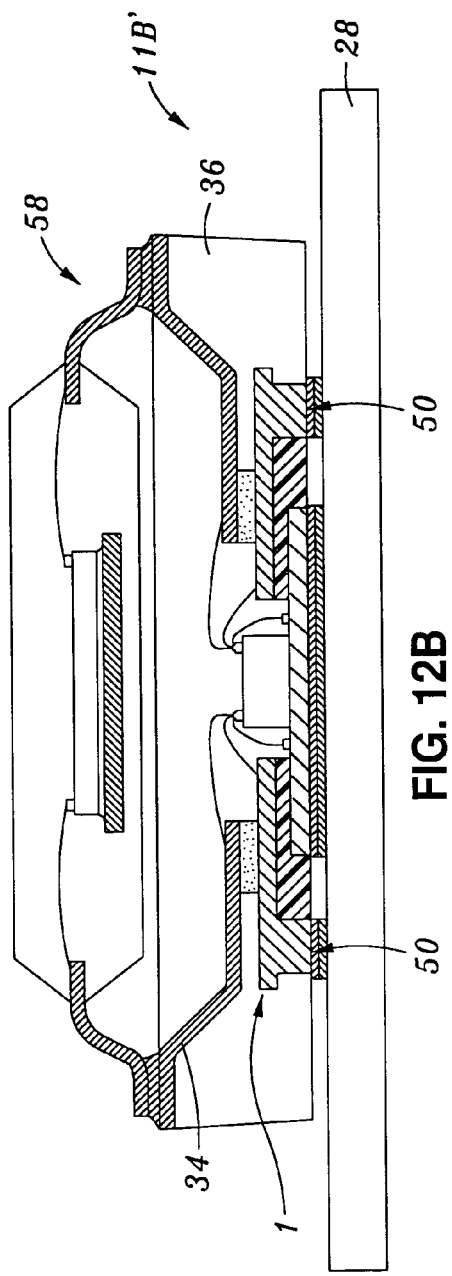
FIG. 12A is an illustrative cross-sectional view of a twenty-fifth exemplary embodiment of the present invention in which a land pattern semiconductor package with the "½ etch molded pedestal" interposer has a second external lead semiconductor package electrically connected thereto.

FIG. 12A is a cross-sectional view of a twenty-fifth exemplary embodiment of the present invention comprising a stacked semiconductor package arrangement including a land pattern semiconductor package 11A' which bears close similarity to the structural and functional attributes of the semiconductor package 11A shown in FIG. 6A. The semiconductor package 11A' includes the interposer 2 described above. However, in contrast to the orientation of the leads 34 in the semiconductor package 11A, the leads 34 in the semiconductor package 11A' are inverted such that the top surfaces of the leads 34 of the leadframe in the semiconductor package 11A' are placed against the pedestal 20 of the interposer 2 thereof. This is in contrast to the semiconductor package 11A described above wherein the bottom surfaces or undersides of the leads 34 thereof are rested against the pedestal 20 of the corresponding interposer 2. Due to the leads 34 in the semiconductor package 11A' being inverted, the bottom surfaces of the distal portions thereof are exposed in the top surface (rather than the bottom surface) of the package body 36 of the semiconductor package 11A'. As a result, when the lands 50 of the interposer 2 in the semiconductor package 11A' are attached to an underlying substrate such as a printed circuit board 28, the exposure portions of the bottom surfaces of the leads 34 in the top surface of the package body 36 provide connection terminals which allow for the electrical connection of a second external lead semiconductor package 58 to the semiconductor package 11A' in the manner shown in FIG. 12A.

Figure 12B:
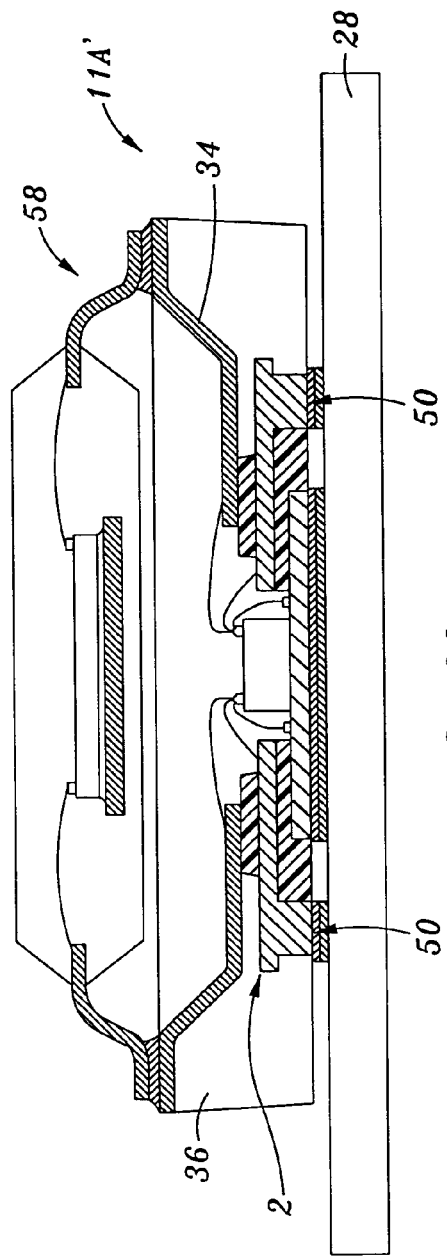
FIG. 12B is an illustrative cross-sectional view of a twenty-sixth exemplary embodiment of the present invention in which a land pattern semiconductor package with the "½ etch molded" interposer has a second external lead semiconductor package electrically connected thereto.

FIG. 12B is a cross-sectional view of a twenty-sixth exemplary embodiment of the present invention which shows a stacked semiconductor package arrangement similar to that shown in FIG. 12A, except that the semiconductor package 11B' shown in FIG. 12B includes the above-described interposer 1 as an alternative to the interposer 2 included in the semiconductor package 11A'. In this regard, the semiconductor package 11B' itself bears substantial similarity to the semiconductor package 11B shown and described above in relation to FIG. 6B, except that the leads 34 in the semiconductor package 11B' are inverted in the same manner the leads 34 are inverted in the semiconductor package 11A'. The inversion of the leads 34 in the semiconductor package 11B' allows for the electrical connection of the second external lead semiconductor package 58 thereto in the manner shown in FIG. 12B.

FIG. 13A is a cross-sectional view of a twenty-seventh exemplary embodiment of the present invention which shows a stacked semiconductor package arrangement similar to that shown in FIG. 12A, except that the semiconductor package 11C' shown in FIG. 13A includes the above-described interposer 4 as an alternative to the interposer 2 included in the semiconductor package 11A'. In this regard, the semiconductor package 11C' itself bears substantial similarity to the semiconductor package 11C shown and described above in relation to FIG. 7A, except that the leads 34 in the semiconductor package 11C' are inverted in the same manner the leads 34 are inverted in the semiconductor package 11A'. The inversion of the leads 34 in the semiconductor package 11C' allows for the electrical connection of the second external lead semiconductor package 58 thereto in the manner shown in FIG. 13A.

FIG. 13B is a cross-sectional view of a twenty-eighth exemplary embodiment of the present invention which shows a stacked semiconductor package arrangement similar to that shown in FIG. 12A, except that the semiconductor package 11D' shown in FIG. 13B includes the above-described interposer 3 as an alternative to the interposer 2 included in the semiconductor package 11A'. In this regard, the semiconductor package 11D' itself bears substantial similarity to the semiconductor package 11D as shown and described above in relation to FIG. 11D, except that the leads 34 in the semiconductor package 11D' are inverted in the same manner that leads 34 are inverted in the semiconductor package 11A'. The inversion of the leads 34 in the semiconductor package 11D' allows for the electrical connection of the second external lead semiconductor package 58 thereto in the manner shown in FIG. 13B.

Figure 14A:
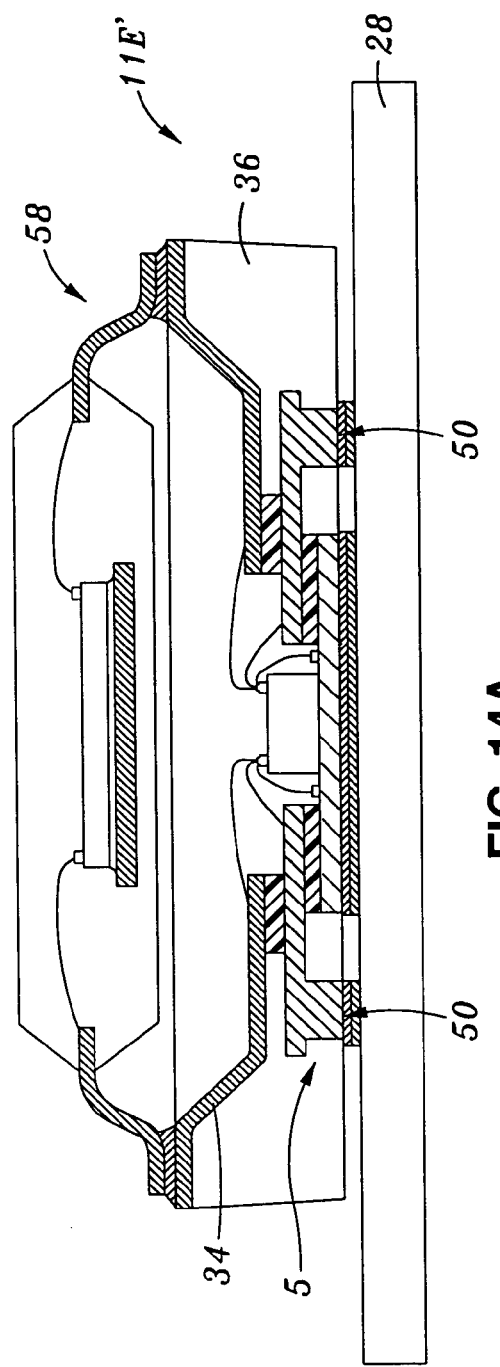
FIG. 14A is an illustrative cross-sectional view of a twenty-ninth exemplary embodiment of the present invention in which a land pattern semiconductor package with the "½ with tape" interposer has a second eternal lead semiconductor package electrically connected thereto.

FIG. 14A is a cross-sectional view of a twenty-ninth exemplary embodiment of the present invention which shows a stacked semiconductor package arrangement similar to that shown in FIG. 12A, except that the semiconductor package 11E' shown in FIG. 14A includes the above-described interposer 5 as an alternative to the interposer 2 included in the semiconductor package 11A'. In this regard, the semiconductor package 11E' bears substantial similarity to the semiconductor package 11E shown and described above in relation to FIG. 8A, except that the leads 34 in the semiconductor package 11E' are inverted in the same manner the leads 34 are inverted in the semiconductor package 11A'. The inversion of the leads 34 in the semiconductor package 11E' allows for the electrical connection of the second external leads semiconductor package 58 thereto in the manner shown in FIG. 14A.

Figure 14B:
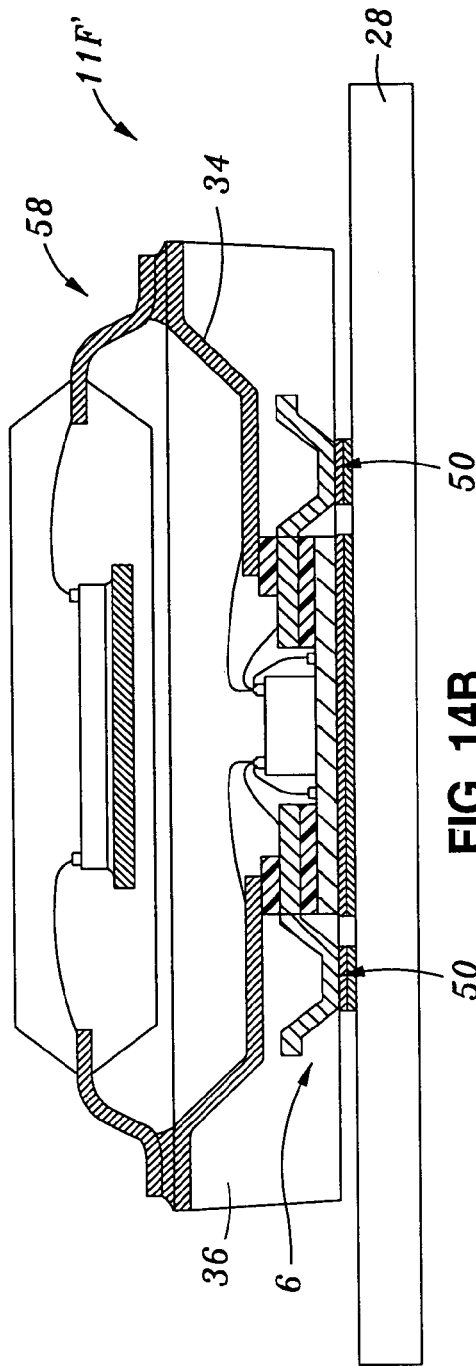
FIG. 14B is an illustrative cross-sectional view of a thirtieth exemplary embodiment of the present invention in which a land pattern semiconductor package with the "downset with tape" interposer has a second external lead semiconductor package electrically connected thereto.

FIG. 14B is a cross-sectional view of a thirtieth exemplary embodiment of the present invention which shows a stacked semiconductor package arrangement similar to that shown in FIG. 12A, except that the semiconductor package 11F' shown in FIG. 14B includes the above-described interposer 6 as an alternative to the interposer 2 included in the semiconductor package 11A'. In this regard, the semiconductor package 11F' bears substantial similarity to the semiconductor package 11F shown and described above in relation to FIG. 8B, except that the leads 34 in the semiconductor package 11F' are inverted in the same manner the leads 34 are inverted in the semiconductor package 11A'. The inversion of the leads 34 in the semiconductor package 11F' allows for the electrical connection of the second external lead semiconductor package 58 thereto in the manner shown in FIG. 14B.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. An interposer for use in a semiconductor package, the interposer comprising:
  an interposer body molded from a dielectric material, the interposer body defining opposed top and bottom surfaces, an outer peripheral edge, and an inner peripheral edge;
  a die pad having opposed top and bottom surfaces and a peripheral edge, the die pad being embedded within the interposer body such that the bottom surface of the die pad is exposed in and substantially flush with the bottom surface of the interposer body, the inner peripheral edge of the interposer body and the top surface of the die pad collectively defining a cavity of the interposer; and
  a plurality of electrically conductive interposer leads embedded within the interposer body, each of the interposer leads defining a finger portion having a top surface which is exposed in and substantially flush with the top surface of the interposer body, the finger portion of each of the interposer leads having an interior terminal end which extends to the cavity and an exterior terminal end which extends beyond the outer peripheral edge of the interposer body, each of the interposer leads further including a downset which is formed within the finger portion thereof in close proximity to the exterior terminal end, the downset being partially covered by the interposer body and defining a land which is exposed in and substantially contiguous with the bottom surface of the interposer body;
  the interposer body forming a non-conductive barrier between each of the interposer leads and between the interposer leads and the die pad.

2. The interposer of claim 1 wherein the land of each of the interposer leads, the bottom surface of the die pad, and the bottom surface of the interposer body extend in generally co-planar relation to each other.

3. The interposer of claim 1 wherein the interposer body includes an integral pedestal which is disposed on the top surface thereof and extends over portions of each of the interposer leads.

4. A semiconductor package, comprising:
- an interposer body molded from a dielectric material, the interposer body defining opposed top and bottom surfaces, an outer peripheral edge, and an inner peripheral edge;
- a die pad having opposed top and bottom surfaces and a peripheral edge, the die pad being embedded within the interposer body such that the bottom surface of the die pad is exposed in and substantially flush with the bottom surface of the interposer body, the inner peripheral edge of the interposer body and the top surface of the die pad collectively defining a cavity of the interposer;
- a plurality of electrically conductive interposer leads embedded within the interposer body, each of the interposer leads defining an exposed land which is substantially contiguous with the bottom surface of the interposer body, the interposer body forming a nonconductive barrier between each of the interposer leads and between the interposer leads and the diepad;
- a plurality of package leads supported by at least one of the interposer body and the interposer leads;
- a semiconductor die attached to the top surface of the die pad and electrically connected to at least some of the interposer leads and the package leads; and
- a package body at least partially covering the semiconductor die, the interposer and the package leads such that at least portions of the package leads, the lands of the interposer leads and the bottom surface of the die pad are exposed in the package body.

5. The semiconductor package of claim 4 wherein the lands and the bottom surface of the die pad are exposed in and substantially flush with a bottom surface of the package body, and portions of the package leads protrude from respective side surfaces of the package body.

6. The semiconductor package of claim 4 wherein the lands, the bottom surface of the die pad, and portions of the package leads are exposed in and substantially flush with a bottom surface of the package body.

7. An interposer for use in a semiconductor package, the interposer comprising:
- a die pad having opposed top and bottom surfaces and a peripheral edge;
- a layer of adhesive tape having a first surface attached to the top surface of the die pad and extending along the peripheral edge thereof, the layer and the top surface of the die pad collectively defining a cavity of the interposer; and
- a plurality of electrically conductive interposer leads attached to a second surface of the adhesive tape which is opposite the first surface and extending at least partially about the die pad in spaced relation to each other, each of the interposer leads defining a land.

8. The interposer of claim 7 wherein each of the interposer leads includes a finger portion having a top surface which extends in spaced, generally parallel relation to the top surface of the die pad and is electrically isolated therefrom by the layer of adhesive tape.

9. The interposer of claim 8 wherein:
- the finger portion of each of the interposer leads has an interior terminal end which extends to the cavity, and an exterior terminal end which extends beyond the peripheral edge of the die pad; and
- each of the interposer leads further includes a protuberance which projects downwardly from the finger portion in close proximity to the exterior terminal end thereof, the protuberance being oriented outward of the peripheral edge of the die pad and defining the land.

10. The interposer of claim 9 wherein the land and the bottom surface of the die pad extend in generally co-planar relation to each other.

11. The interposer of claim 8 wherein:
- the finger portion of each of the interposer leads has an interior terminal end which extends to the cavity and an exterior terminal end which extends beyond the peripheral edge of the die pad; and
- each of the interposer leads includes a downset which is formed within the finger portion thereof in close proximity to the exterior terminal end, the downset defining the land.

12. The interposer of claim 11 wherein the land and the bottom surface of the die pad extend in generally co-planar relation to each other.

13. The interposer of claim 7, further in combination with:
- a plurality of package leads supported by the interposer leads;
- a semiconductor die attached to the top surface of the die pad and electrically connected to at least some of the interposer leads and the package leads; and
- a packaged body at least partially covering the semiconductor die, the interposer and the package leads such that at least portions of the package leads, the lands of the interposer leads and the bottom surface of the die pad are exposed in the package body.

14. The interposer of claim 13 wherein the lands and the bottom surface of the die pad are exposed in and substantially flush with a bottom surface of the package body, and portions of the package leads protrude from respective side surfaces of the package body.

15. The interposer of claim 13 wherein the lands, the bottom surface of the die pad, and portions of the package leads are exposed in and substantially flush with a bottom surface of the package body.

* * * * *